United States Patent
Wu et al.

(10) Patent No.: US 8,299,564 B1
(45) Date of Patent: Oct. 30, 2012

(54) DIFFUSION REGIONS HAVING DIFFERENT DEPTHS

(75) Inventors: Yun Wu, San Jose, CA (US); Bei Zhu, Los Gatos, CA (US); Zhiyuan Wu, San Jose, CA (US); Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 488 days.

(21) Appl. No.: 12/559,457

(22) Filed: Sep. 14, 2009

(51) Int. Cl.
*H01L 21/336* (2006.01)
*H01L 21/8234* (2006.01)

(52) U.S. Cl. ........ 257/509; 257/499; 257/500; 257/183; 257/192; 257/200; 257/201; 438/700; 438/743

(58) Field of Classification Search .................. 257/183, 257/192, 200, 201, 499, 500, 506; 438/700–743
See application file for complete search history.

(56) References Cited

U.S. PATENT DOCUMENTS

| | | | |
|---|---|---|---|
| 6,486,070 B1 * | 11/2002 | Ho et al. | 438/706 |
| 7,307,025 B1 * | 12/2007 | Worsham et al. | 438/711 |
| 8,071,442 B2 * | 12/2011 | Kronholz et al. | 438/256 |
| 2009/0288048 A1 * | 11/2009 | Moroz et al. | 716/4 |

OTHER PUBLICATIONS

Choi, A. et al. "Low Temperature selective epitaxial growth of SiGe layers using various dielectric mask patterns and process conditions", Applied Surface Science, V 254, Jul. 2008, pp. 6081-6085.
Loo, R. et al. "Avoiding loading effects and facet growth Key parameters for a successful implementation of selective epitaxial SiGe deposition for HBT-BiCMOSand high-mobility hetero-channel pMOS devices", Applied Surface Science, V. 224, Mar. 2004, pp. 24-30.

* cited by examiner

*Primary Examiner* — Kenneth Parker
*Assistant Examiner* — David Spalla
(74) *Attorney, Agent, or Firm* — W. Eric Webostad

(57) ABSTRACT

Formation of transistors, such as, e.g., PMOS transistors, with diffusion regions having different depths for equalization of performance among transistors of an integrated circuit is described. Shallow-trench isolation structures are formed in a substrate formed at least in part of silicon for providing the transistors with at least substantially equivalent channel widths and lengths. A series of masks and etches is performed to form first recesses and second recesses defined in the silicon having different depths and respectively associated with first and second transistors. The second recesses are deeper than the first recesses. A silicon germanium film is formed in the first recesses and the second recesses. The silicon germanium film in the second recesses is thicker than the silicon germanium film in the first recesses, in order to increase performance of the second transistor so it is closer to the performance of the first transistor.

12 Claims, 17 Drawing Sheets

DIFFUSION REGIONS HAVING DIFFERENT DEPTHS

FIELD OF THE INVENTION

The invention relates to integrated circuit devices ("ICs"). More particularly, the invention relates to diffusion regions having different depths engineered for stress of a formed layer therein for equalization of performance among transistors of an IC.

BACKGROUND OF THE INVENTION

As transistors are formed with smaller lithographies, such as lithographies less than 100 nanometers ("nm"), variation among transistors becomes more problematic with respect to performance. More particularly, as devices are formed smaller, the susceptibility to differences in topology of such devices generally has more of an effect on performance than for example devices formed with lithographies greater than 100 nm. Along those lines, transistors formed with different lengths of diffusion ("LODs") or pitches may have different performance levels due to such differences. By LOD, it is generally meant the distance from an edge of an active transistor gate to an edge of a neighboring shallow trench isolation ("STI") structure. These different performance levels may exist for transistors of different LODs or pitches even though channel width and length of such transistors is the same. Furthermore, it should be understood that such transistors may have different performance even though materials for forming such transistors is the same. Another factor that exacerbates this performance difference in PMOS is a conventional stress engineering practice for lithographies of less than 100 nm technologies of having an embedded silicon germanium ("eSiGe") layer. Growing eSiGe in PMOS source/drain regions is to increase the compressive stress along a PMOS transistor channel direction (or longitudinal x-axis direction). Some device studies have shown substantially enhanced carrier mobility for PMOS due to compressive stress along a longitudinal or x-axis direction, and tensile stress along a lateral or y-axis direction and along a vertical or z-axis direction. Therefore such eSiGe layer is conventionally used for PMOS source and drain regions for the purpose of adding stress along the channel, where such source and drain regions are uniformly etched to a same depth.

The above-mentioned LOD effect may result in significant variation among transistors. Such variations may be in one or more of the following parameters: threshold voltage (Vt), channel saturation current (Idsat), and off current (Ioff). Comparing PMOS transistors with same channel width and length ("W/L") where some have wide LODs compared to others with narrow LODs, those PMOS transistors with a narrow LOD show degradation of Idsat due to worse mobility. In other words, when compared at a fixed Idsat, PMOS transistors with relatively narrow LODs tend to show lower Vt versus those transistors with significantly wider LODs.

These transistor performance variations could have several negative impacts upon ICs. First, such variations could introduce reduction in IC performance as lowered Idsat may result in a slower slowest path which may limit overall IC performance. Secondly, such transistor performance variations could contribute to higher Icc leakage current, because faster transistors may have higher off or standby current, and if the variation goes to a minimized state all of the Icc current could be reduced due to a tighter Ioff current distribution. Another factor is performance mismatch of transistors with same W/L due to LOD effects, and such differences may negatively affect circuit functionality in some instances.

Accordingly, it would be both desirable and useful to provide means for reducing the above mentioned variations among transistors of different LODs.

SUMMARY OF THE INVENTION

One or more embodiments generally relate to integrated circuit devices ("ICs") and, more particularly, to diffusion regions having different depths engineered for stress of a formed layer therein for equalization of performance among transistors of an IC.

An embodiment relates generally to a method for forming devices of an integrated circuit. In this embodiment, a substrate formed at least in part of silicon is obtained, and shallow-trench isolation structures are formed in the substrate. A dielectric gate layer is formed above the substrate. A conductive gate layer is formed above the dielectric gate layer. The dielectric gate layer and the conductive gate layer are for transistor devices and have at least substantially equivalent channel widths and lengths. A first transistor of the transistor devices has a first source side spacing and a first drain side spacing. A second transistor of the transistor devices has a second source side spacing and a second drain side spacing. A first source region and a first drain region of the first transistor are respectively first etched associated with the first source side spacing and the first drain side spacing and a second source region and a second drain region of the second transistor are respectively first etched associated with the second source side spacing and the second drain side spacing. A masking layer is deposited and patterned. The masking layer after patterning covers the first source region and the first drain region and leaves exposed the second source region and the second drain region. The second source region and the second drain region are second etched to remove respective portions of the silicon. The first etching and the second etching form first recesses and second recesses, and the second recesses are deeper than the first recesses. A silicon germanium film is formed in the first recesses and the second recesses, wherein the silicon germanium film in the second recesses is thicker than the silicon germanium film in the first recesses.

In this embodiment, the first source side spacing can be lateral from a channel of the first transistor to a first shallow-trench isolation structure of the shallow-trench isolation structures; the first drain side spacing can be lateral from the channel of the first transistor to a second shallow-trench isolation structure of the shallow-trench isolation structures; the second source side spacing can be lateral from a channel of the second transistor to a third shallow-trench isolation structure of the shallow-trench isolation structures; the second drain side spacing can be lateral from the channel of the second transistor to a fourth shallow-trench isolation structure of the shallow-trench isolation structures; the first source side spacing can be substantially greater than the second source side spacing; the first drain side spacing can be substantially greater than the second drain side spacing; the channel of the first transistor can have at least substantially equivalent length and width to the channel of the second transistor.

In this embodiment, the first source region, the second source region, the first drain region, and the second drain region can be of the silicon of the substrate; the first recesses can be associated with the first source region and the first drain region; the second recesses can be associated with the second source region and the second drain region; the silicon germanium film in the second recesses can be thicker than the silicon germanium film in the first recesses for increasing performance of the second transistor to be closer to equal or equal with performance of the first transistor; the forming of the silicon germanium film can be by selective epitaxial growth; the second recesses can be at least 20 nanometers deeper than the first recesses; the silicon germanium layer in the second recesses by being thicker than the silicon germanium film in the first recesses can increase performance of the second transistor by at least 5 percent relative to performance of the first transistor; a dielectric spacer layer can be deposited above the conductive gate layer; the dielectric spacer layer can be etched prior to the first etching and the second etching; and the depositing and patterning of the masking layer and the second etching can be performed prior to the first etching.

Another embodiment of a method for forming a device of an integrated circuit includes: a substrate formed at least in part of silicon is obtained, and shallow-trench isolation structures are formed in the substrate. A dielectric gate layer is formed above the substrate. A conductive gate layer is formed above the dielectric gate layer. A first hard mask layer is formed above the conductive gate layer. A second hard mask layer is deposited above the first hard mask layer. The dielectric gate layer and the conductive gate layer for transistor devices have at least substantially equivalent channel widths and lengths. A first transistor of the transistor devices has a first source side spacing and a first drain side spacing. A second transistor of the transistor devices has a second source side spacing and a second drain side spacing. The first source side spacing is substantially greater than the second source side spacing. The first drain side spacing is substantially greater than the second drain side spacing. A masking layer is deposited and patterned. The masking layer after patterning leaves exposed the first source region, the first drain region, the second source region, and the second drain region. At least one etch is performed. The second hard mask layer is etched leaving spacers formed of the second hard mask layer associated with the first transistor and the second transistor. The spacers are disposed along sidewalls of the first hard mask layer conforming to sidewalls of a gate of the first transistor and to sidewalls of a gate of the second transistor. The etching forms first recesses and second recesses, and the second recesses are deeper than the first recesses. A silicon germanium film is formed in the first recesses and the second recesses. The silicon germanium film in the second recesses is thicker than the silicon germanium film in the first recesses.

In this embodiment, the first source side spacing can be lateral from a channel of the first transistor to a first shallow-trench isolation structure of the shallow-trench isolation structures; the first drain side spacing can be lateral from the channel of the first transistor to a second shallow-trench isolation structure of the shallow-trench isolation structures; the second source side spacing can be lateral from a channel of the second transistor to a third shallow-trench isolation structure of the shallow-trench isolation structures; the second drain side spacing can be lateral from the channel of the second transistor to a fourth shallow-trench isolation structure of the shallow-trench isolation structures; the channel of the first transistor can be at least substantially equivalent in length and width to the channel of the second transistor; the first transistor can include a first source region and a first drain region respectively associated with the first source side spacing and the first drain side spacing; the second transistor can include a second source region and a second drain region respectively associated with the second source side spacing and the second drain side spacing.

In this embodiment, the first recesses can be associated with the first source region and the first drain region; the second recesses can be associated with the second source region and the second drain region; the forming of a silicon germanium film can be by selective epitaxial growth; the silicon germanium layer in the second recesses can increase carrier mobility of the second transistor by at least 90 percent to increase performance of the second transistor to be closer to or equal with performance of the first transistor; a dielectric spacer layer can be deposited above the conductive gate layer prior to the forming of the first hard mask layer; the gate of the first transistor and the gate of the second transistor can both be formed using the conductive gate layer; an etch of the dielectric spacer layer can be performed prior to the forming of the first hard mask layer; the second recesses can be at least 20 nanometers deeper than the first recesses; and the substrate can be selected from the group consisting of a bulk silicon wafer and a silicon-on-insulator wafer. The etching can include a first etching, a second etching, a third etching, a fourth etching, and a fifth etching, wherein: the first etching can remove the second hard mask layer above the first source region, the first drain region, the second source region, and the second drain region; the second etching can remove the first hard mask layer above the second source region and the second drain region in contrast to the first hard mask layer above the first source region and the first drain region; the second etching can remove the first hard mask layer in part responsive to loading effects of the second source side spacing and the second drain side spacing; the third etching can be into the silicon in the second source region and the second drain region and can remove respective portions of the silicon; the fourth etching can remove the first hard mask layer above the first source region and the first drain region; and the fifth etching can remove the silicon in the first source region and the first drain region as well as the second source region and the second drain region.

Yet another embodiment relates generally to an integrated circuit having devices. In this embodiment, the integrated circuit includes: a first transistor associated with a first pitch, and a second transistor associated with a second pitch. The second pitch is substantially smaller than the first pitch. A first channel of the first transistor has a first width and a first length. A second channel of the second transistor has a second width and a second length, the first width being at least approximately equivalent to the second width and the first length being at least approximately equivalent to the second length. The first transistor has a first source region and a first drain region, and the second transistor has a second source region and a second drain region. Each of the first source region and the first drain region is substantially wider in a horizontal direction than the second source region and the second drain region responsive to the second pitch being substantially smaller than the first pitch. Each of the second source region and the second drain region is deeper in a vertical direction than the first source region and the first drain region to increase performance of the second transistor so it is closer to performance of the first transistor.

In this embodiment, the integrated circuit can further include: a substrate having silicon; shallow-trench isolation structures in the substrate; a dielectric gate layer disposed above the substrate; a conductive gate layer disposed above the dielectric gate layer; a first hard mask layer disposed along sidewalls of the conductive gate layer; a second hard mask layer disposed along sidewalls of the first hard mask layer; wherein the first hard mask layer and the second hard mask layer provide spacers; the dielectric gate layer and the conductive gate layer for transistor devices can have substantially equal channel widths and lengths; the first transistor being of the transistor devices; the first transistor has a first source side spacing and a first drain side spacing associated with the first pitch; the first source side spacing is lateral from the first channel of the first transistor to a first shallow-trench isolation structure of the shallow-trench isolation structures; the first drain side spacing is lateral from the first channel of the first transistor to a second shallow-trench isolation structure of the shallow-trench isolation structures; the second transistor being of the transistor devices; the second transistor has a second source side spacing and a second drain side spacing associated with the second pitch; the second source side spacing is lateral from the second channel of the second transistor to a third shallow-trench isolation structure of the shallow-trench isolation structures; the second drain side spacing is lateral from the second channel of the second transistor to a fourth shallow-trench isolation structure of the shallow-trench isolation structures; the first source side spacing is substantially greater than the second source side spacing; the first drain side spacing is substantially greater than the second drain side spacing; the first source region and the first drain region respectively associated with the first source side spacing and the first drain side spacing; the second source region and the second drain region respectively associated with the second source side spacing and the second drain side spacing; first recesses and second recesses defined in-process in the silicon having different depths in which a silicon germanium film is formed; the first recesses are associated with the first source region and the first drain region; the second recesses are associated with the second source region and the second drain region; and the second recesses are at least 20 nanometers deeper than the first recesses.

In this embodiment, the integrated circuit can further include: a third transistor associated with a third pitch; where the third pitch is between the first pitch and the second pitch; a third channel of the third transistor has a third width and a third length, where the third width is at least approximately equal to the second width, and the third length is approximately equal to the second length, and where the third transistor has a third source region and a third drain region; one of the third source region and the third drain region is substantially narrower in a horizontal direction than the other of the third source region and the third drain region; and the narrower one of the third source region and the third drain region is at least 20 nanometers deeper in a vertical direction than the other of the third source region and the third drain region to increase performance of the third transistor so it is closer to performance of the first transistor.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 10-1 and 10-2, is a flow diagram depicting an exemplary embodiment of an alternative PMOS device formation flow.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
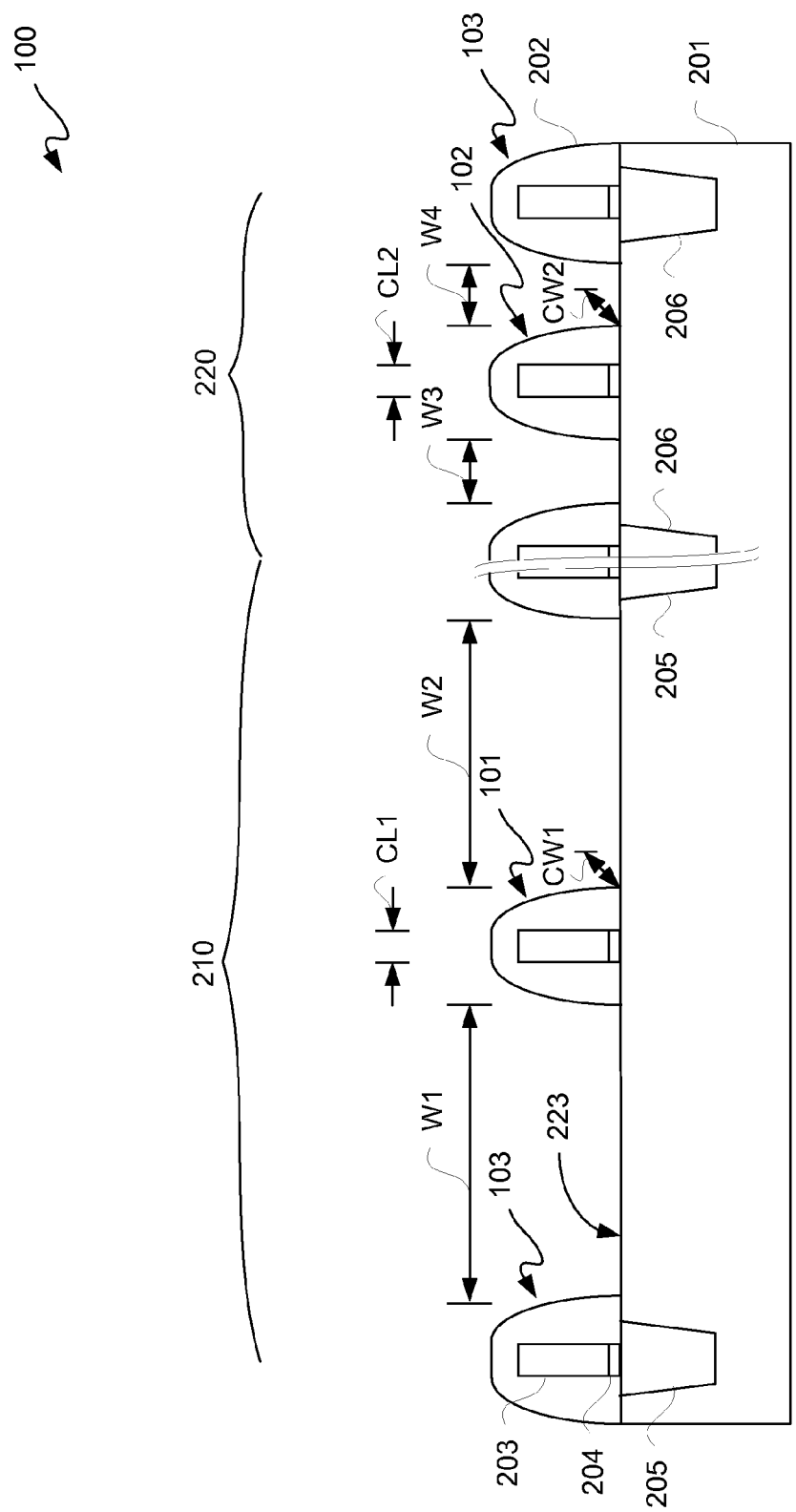
FIG. 1 is a cross-sectional view depicting an exemplary embodiment of an in-process integrated circuit.

FIG. 1 is a cross-sectional view depicting an exemplary embodiment of an in-process integrated circuit 100. Integrated circuit 100 includes transistors formed using different pitches, as generally indicated by a first pitch region 210 and a second pitch region 220. Transistors, such as one or more of transistors 101, are formed in a first pitch region 210 between shallow-trench isolation ("STI") structures 205. One or more transistors 102 are formed in a second pitch region 220 between STI structures 206. It should be understood that where the break is illustratively depicted through what appears as two separate STI structures 205 and 206, may in another embodiment be the same STI structure, namely a shared STI structure where narrow pitch region 220 borders wide pitch region 210.

A gate dielectric layer 204, which may be formed of one or more dielectric films, is deposited on an upper surface 223 of silicon layer 201. Silicon layer 201 may be from a bulk silicon substrate or an SOI substrate or wafer. On gate dielectric layer 204 is a gate conductive layer 203, which may be formed of one or more conductive films. Transistors 103 located above STI structures 205 and 206 are dummy transistors, namely non-operative transistors, and may be used for purposes of lithographic printing symmetry. Spacers 202 may be formed along sidewalls of gate dielectrics and gate conductors (collectively "gate stacks"), and a portion of spacer layer 202 extending above the gate stacks may be subsequently removed at least in part for forming an conductive contact to a gate of a transistor 101.

Spacers 202 may be used for self-alignment of an etch for forming source and drain regions, as described below in additional detail. For purposes of clarity by way of example and not limitation, a single instance of each of transistors 101 and 102 is described for clarity, as it will be understood that multiple transistors of each may be formed.

A transistor 101 has LOD regions respectively associated with a width W1 and a width W2. Width W1 and width W2 are openings between spacers 202 within wide pitch region 210. Transistor 102 has LOD regions respectively associated with a width W3 and a width W4 between spacers 202 within narrow pitch region 220. LOD regions associated with widths W1 through W4 are for source and drain regions of transistors 101 and 102 as described below in additional detail.

Transistor 101 has a channel length CL1 and transistor 102 has a channel length CL2. CL1 and CL2 may be at least substantially equal to one another. Channel widths CW1 of transistor 101 and channel width CW2 of transistor 102 are generally indicated in FIG. 1 as going into the page. Channel width is conventionally the width of LOD regions of a transistor. Channel widths CW1 and CW2 are at least substantially equal to one another.

For purposes of clarity by way of example and not limitation, it shall be assumed that narrow pitch region 220 is a minimum pitch region of integrated circuit 100. Furthermore, for purposes of clarity by way of example and not limitation, it shall be assumed that wide pitch region 210 is a maximum pitch region of integrated circuit 100. Additionally, for purposes of clarity by way of example and not limitation, it shall be assumed that in this embodiment, integrated circuit 100 has a minimum dimension lithography of 50 nm or less. However, it should be understood that: integrated circuit 100 may have a larger minimum dimension lithography, such as 100 nm or less; narrow pitch region 220 may be wider than a minimum pitch region; and/or wide pitch region 210 may be narrower than a maximum pitch region of integrated circuit 100.

Transistors are generally formed of the same materials and the same configuration where channel length and channel width are the same. However, when dealing with devices formed using 100 nm or less lithographies, topology, such as pitch, can affect the performance of the device. This is problematic for transistors that are presumed to have equivalent performance capabilities. In particular, transistor 102 formed in narrow pitch region 220 may have less performance due to a decrease in electron mobility in its LOD regions as compared with transistor 101 formed in wide pitch region 220.

Figure 2A:
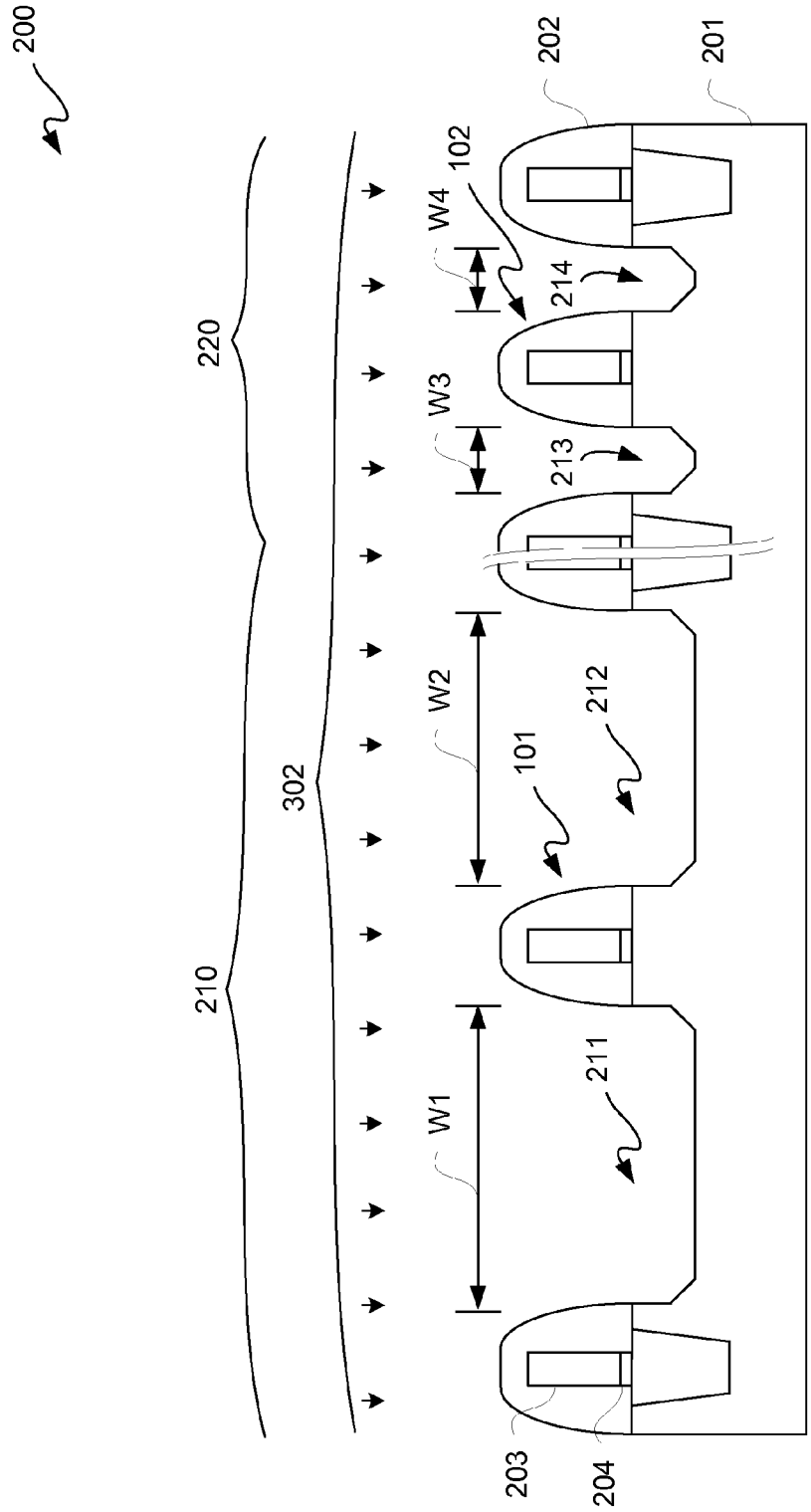
FIGS. 2A and 2B are cross-sectional views depicting an exemplary embodiment of an in-process integrated circuit starting from the in-process integrated circuit of FIG. 1.

Referring to FIG. 2A, there is shown a cross-sectional view depicting an exemplary embodiment of an integrated circuit 200. Integrated circuit 200 is integrated circuit 100 of FIG. 1 after or during etching via anisotropic etch 302. A plasma ("recess") etch 302 may be used to form recesses or trenches 211 through 214 in silicon layer 201. For purposes of clarity by way of example and not limitation, it shall be assumed that silicon layer 201 is of a bulk silicon wafer. Trenches 211 and 212 have widths corresponding to widths W1 and W2, respectively, and trenches 213 and 214 have widths corresponding to widths W3 and W4, respectively. Trenches 211 and 212 are for source and drain regions for transistors 101, and trenches 213 and 214 are for source and drain regions for transistors 102. For purposes of clarity and not limitation, it shall be assumed that transistors 101 and 102 are PMOS devices. Thus, recess etch 302 may be for PMOS devices only, where NMOS devices (not shown) of integrated circuit 200 are masked off. Integrated circuit 200 may be a silicon/silicon-germanium hereto-CMOS device, as described below in additional detail.

Figure 2B:
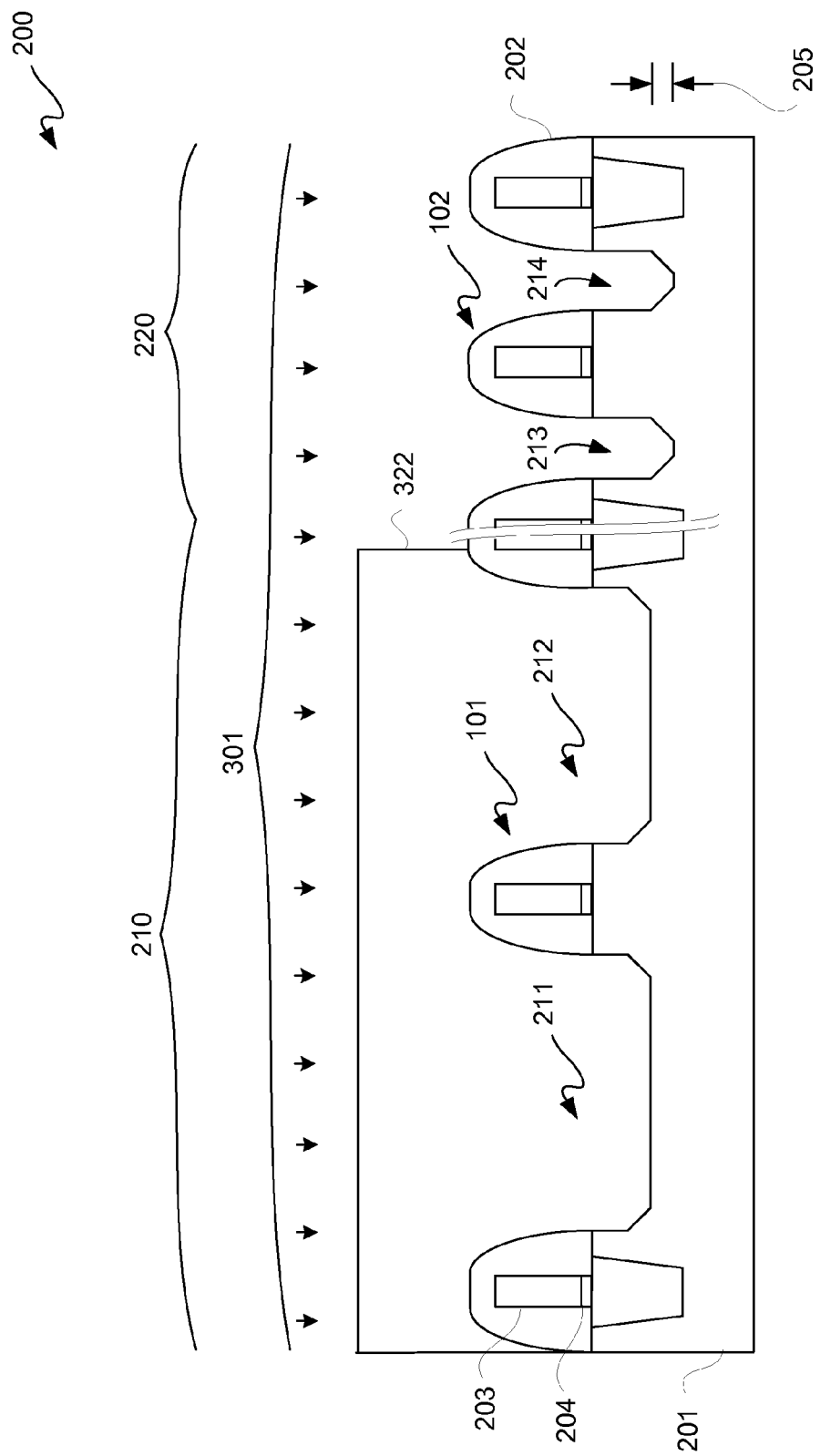

Referring to FIG. 2B, there is shown the cross-sectional view of FIG. 2A after depositing and patterning mask 322. Mask 322 may be formed of a resist, such as a photoresist, to mask off transistors 101. Accordingly, trenches 211 and 212 may be masked off from recess etch 301. Recess etch 301, like recess etch 302, is for removing silicon of silicon layer 201. However, because trenches 211 and 212 are masked off, only trenches 213 and 214 are further etched by recess etch 301. Thus, the relatively small source drain diffusion regions associated with narrow pitch region 220 are further etched for PMOS transistor 102. This results in trenches 213 and 214 being deeper than trenches 211 and 212. This difference in depth 205 may be as little as 10 to 20 nm, but generally a depth difference of 20 nm or more, for reasons described below in additional detail, may be implemented.

Figure 3A:
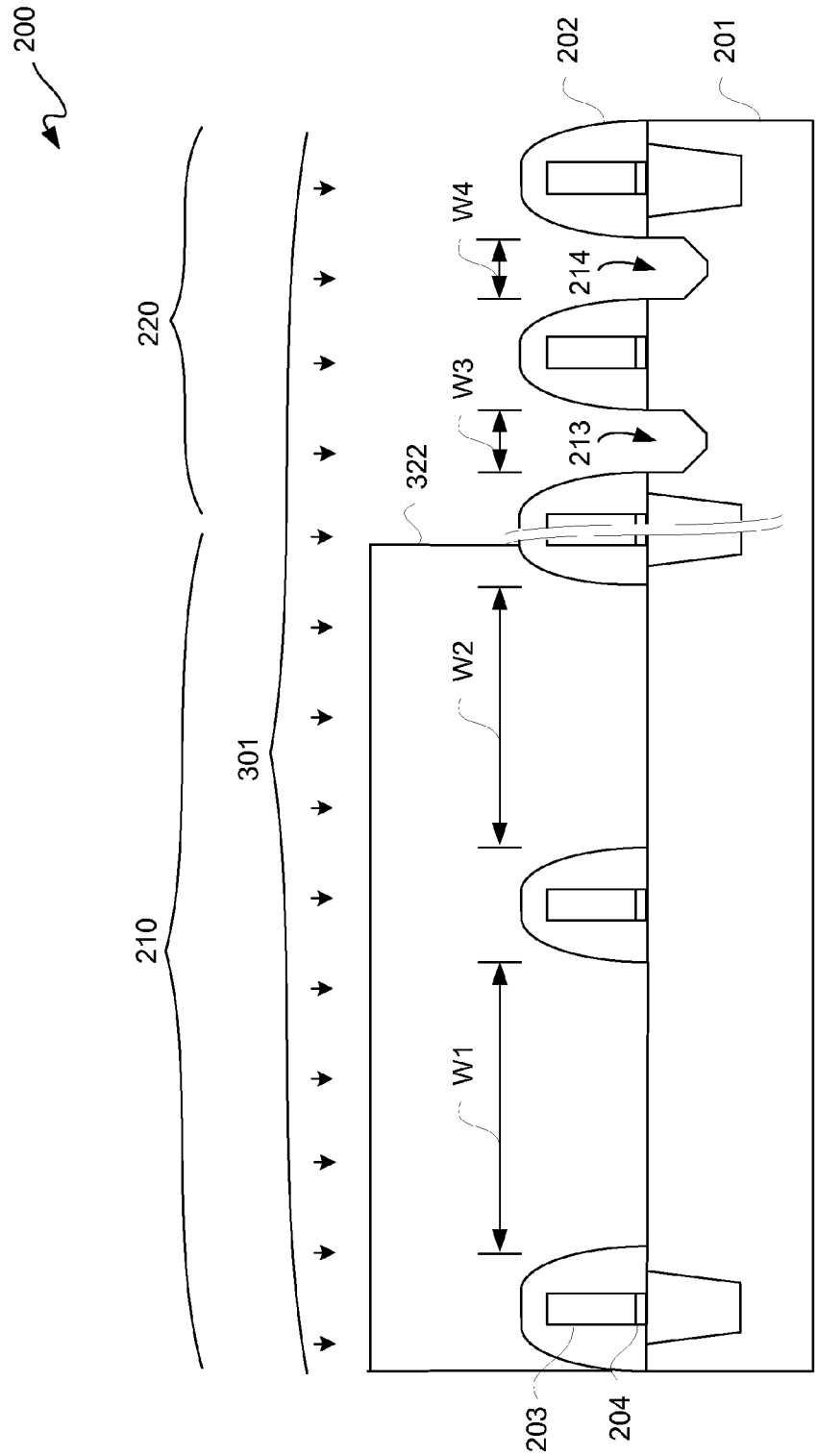
FIGS. 3A and 3B are cross-sectional views depicting another exemplary embodiment of an in-process integrated circuit starting from the in-process integrated circuit of FIG. 1.

Referring to FIG. 3A, there is shown a cross-sectional view of another embodiment for forming integrated circuit 200. In this embodiment, recess etch 301 precedes recess etch 302. Mask 322 is deposited and patterned prior to etch 301. Recess etch 301 is for initially forming trenches 213 and 214.

Figure 3B:
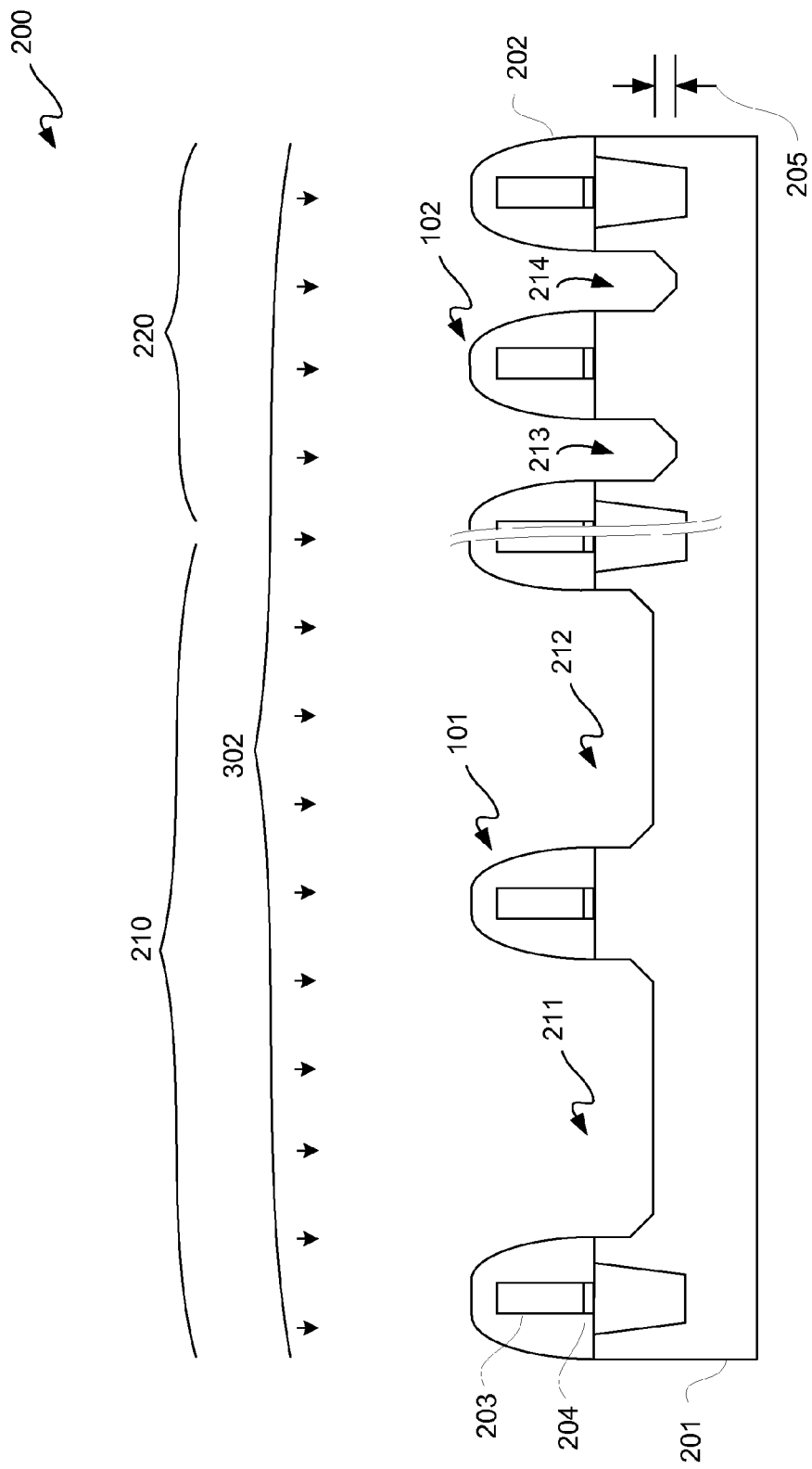

Referring to FIG. 3B, there is shown the cross-sectional view of FIG. 3A after or during recess etch 302. Mask 322 has been removed for recess etch 302, and recess etch 302 is used to form trenches 211 and 212, as well as to extend the depth of trenches 213 and 214 initially formed with recess etch 301. Again, a difference in depth between trenches 211 and 212 of wide pitch region 210 and trenches 213 and 214 of narrow pitch region 220, namely difference 205, is at least 10 nm, and more generally at least 20 nm.

Figure 4:
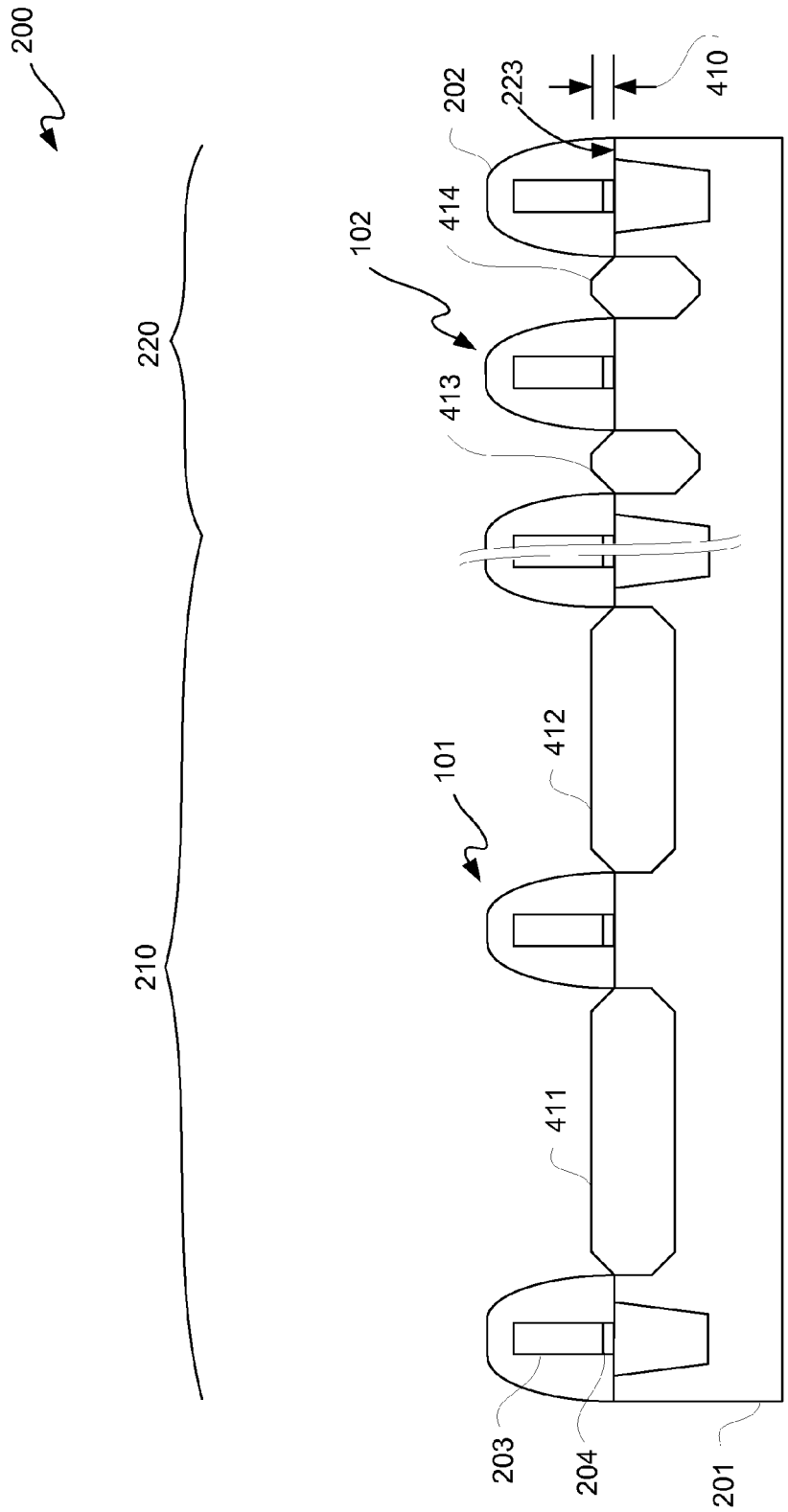
FIG. 4 is a cross-sectional view depicting an exemplary embodiment of an in-process integrated circuit resulting from the embodiment of FIGS. 2A and 2B and the embodiment of FIGS. 3A and 3B.

Thus, either after removing mask 322 of FIG. 2B or after performing recess etch 302 of FIG. 3B, the resultant structure of integrated circuit 200 may be the same or at least substantially the same for either of the embodiments of FIGS. 2A and 2B or 3A and 3B. Such resultant structure is illustratively shown in the cross-sectional view of FIG. 4 after forming source and drain regions using epitaxial growth. More particularly, a selective epitaxial growth ("SEG") of silicon germanium is used for forming source and drain regions 411 through 414. For etching, such as recess etch 302 of FIG. 2A and FIG. 3B, loading effects cause areas that are more open or wider to etch silicon layer 201 faster than areas that are more closed off or narrower. Thus, silicon layer 201 in wide pitch area 210 tends to etch faster than silicon layer 201 in narrow pitch area 220. In contrast to loading effects of recess etch 302, SEG for forming a silicon-germanium film or films for source drain regions 411 through 414 has a faster growth rate with respect to narrow openings than wider openings due to loading effects. SEG is described in additional detail in "Avoiding Loading Effects in Facet Growth Key Parameters for a Successful Implementation of Selective Epitaxial SiGe Deposition for HBT-BiCMOS and High-Mobility Hetero-Channel PMOS Devices," by Roger Loo and Matty Caymax, Applied Surface Science, Volume 224, March 2004, Pages 24-30, and "Low Temperature Selective Epitaxial Growth of SiGe Layers Using Various Dielectric Mask Patterns and Process Conditions," by A-Ram Choi, et al., Applied Surface Science, Volume 254, July 2008, Pages 6081-6085.

Because SiGe grows faster in trenches 213 and 214 for forming respective source and drain regions 413 and 414 in comparison with SiGe growth in trenches 211 and 212 for respectively forming source and drain regions 411 and 412, the overall height differential above an upper surface 223 of silicon layer 201, namely a height differential 410, that regions 411 through 414 extend may be controlled. In other words, due to use of loading effects, height differential 410 for regions 411 through 414 may be approximately the same even though trenches 213 and 214 are deeper than trenches 211 and 212. Controlling height differential 410 facilitates having a stress liner deposited above regions 411 through 414 relatively close to channels of transistors 101 and 102 for enhancing performance of such transistors. Such stress liner is not illustratively depicted, but is well known.

Figure 5:
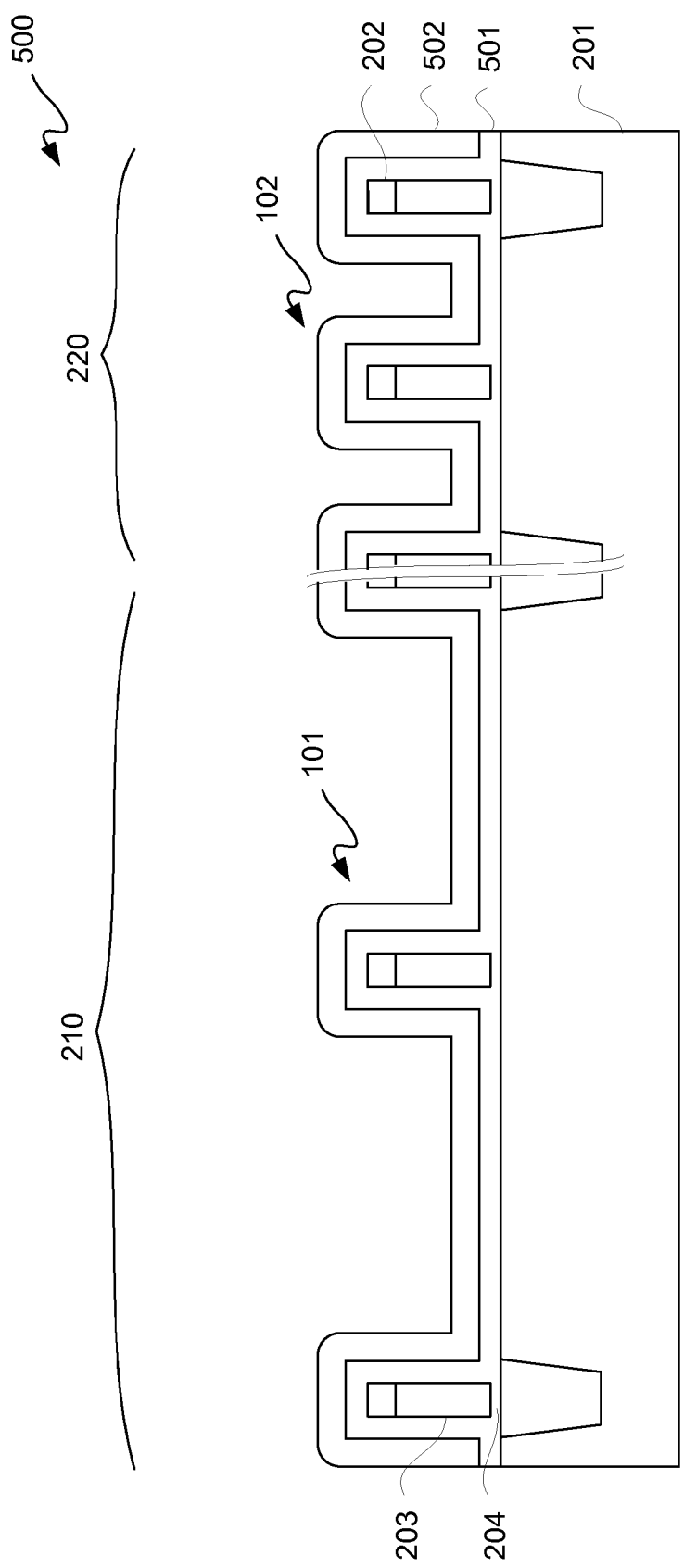
FIGS. 5, 6, 7A-7D, and 8 are cross-sectional views depicting an exemplary embodiment of another in-process integrated circuit starting from the in-process integrated circuit of FIG. 1.

FIG. 5 is the cross-sectional view of FIG. 1 after deposition of conformal layers 501 and 502 for forming integrated circuit 500. Conformal layer 501 may be a first hard mask layer, and conformal layer 502 may be a second hard mask layer. Hard mask layer 501 may be formed of an oxide, and hard mask layer 502 may be formed of a nitride. Optionally, spacer layer 202 may be deposited prior to hard mask layer 501 to protect conductive gate layer 203 during an etch of silicon layer 201. Furthermore, it should be understood that conductive layer 203 in FIGS. 2A, 2B, 3A, and 3B, is protected by a dielectric spacer layer 202, such as a nitride layer 202, from recess etches 301 and 302. However, this assumes that the material used for gate conductive layer 203 is a polysilicon, and thus would be removed by recess etches 301 and 302. However, more recently metal gates have been used as a capping layer of a gate stack. Accordingly, having spacer layer 202 protecting an upper surface of a gate stack gate conductive layer 203 may be optional when gate conductive layer 203 is not susceptible or at least only minimally susceptible to etching by recess etches 301 and 302.

In the embodiment of FIG. 5, it shall be assumed that an etch has been performed to leave only a top portion of layer 202 for protecting polysilicon gates 203 from etching. However, it should be appreciated that in other embodiments spacer layer 202 may be omitted.

Figure 6:
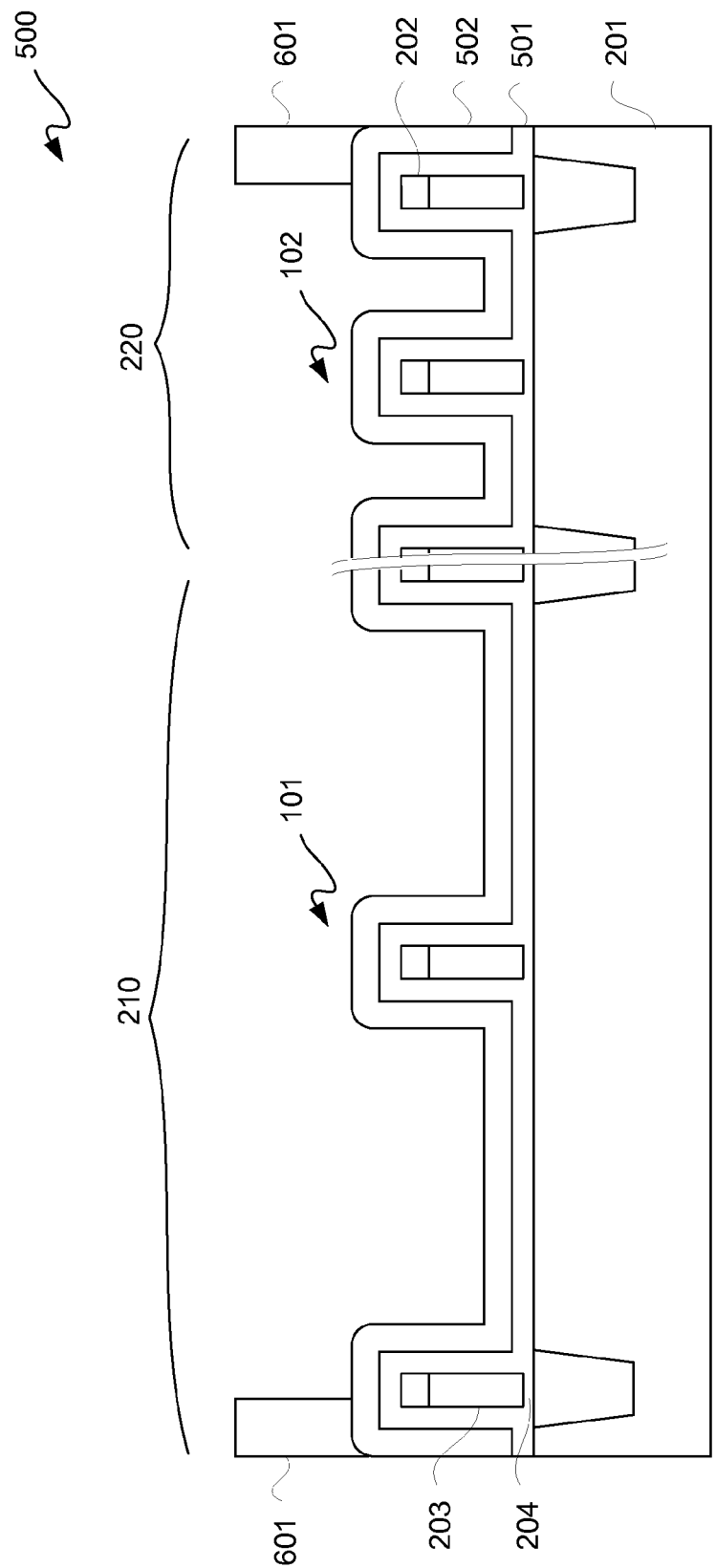

Referring to FIG. 6, there is shown the cross-sectional view of FIG. 5 after depositing and patterning a masking layer 601. Masking layer 601 may be formed with a resist, such as with a photoresist. Masking layer 601 is to protect NMOS devices while exposing PMOS devices to subsequent etching as described below in additional detail, for Si/SiGe hetero-CMOS structures of integrated circuit 500. Again, it shall be assumed that transistors 101 and 102 are PMOS devices.

It should be understood that no additional mask, as previously described for example with reference to FIGS. 2B and 3A, is used. Rather, masking layer 601 may be a conventional masking layer used to protect NMOS devices while processing PMOS devices, and thus such masking layer 601 may be left in place without having to add another masking deposition and patterning.

Figure 7A:
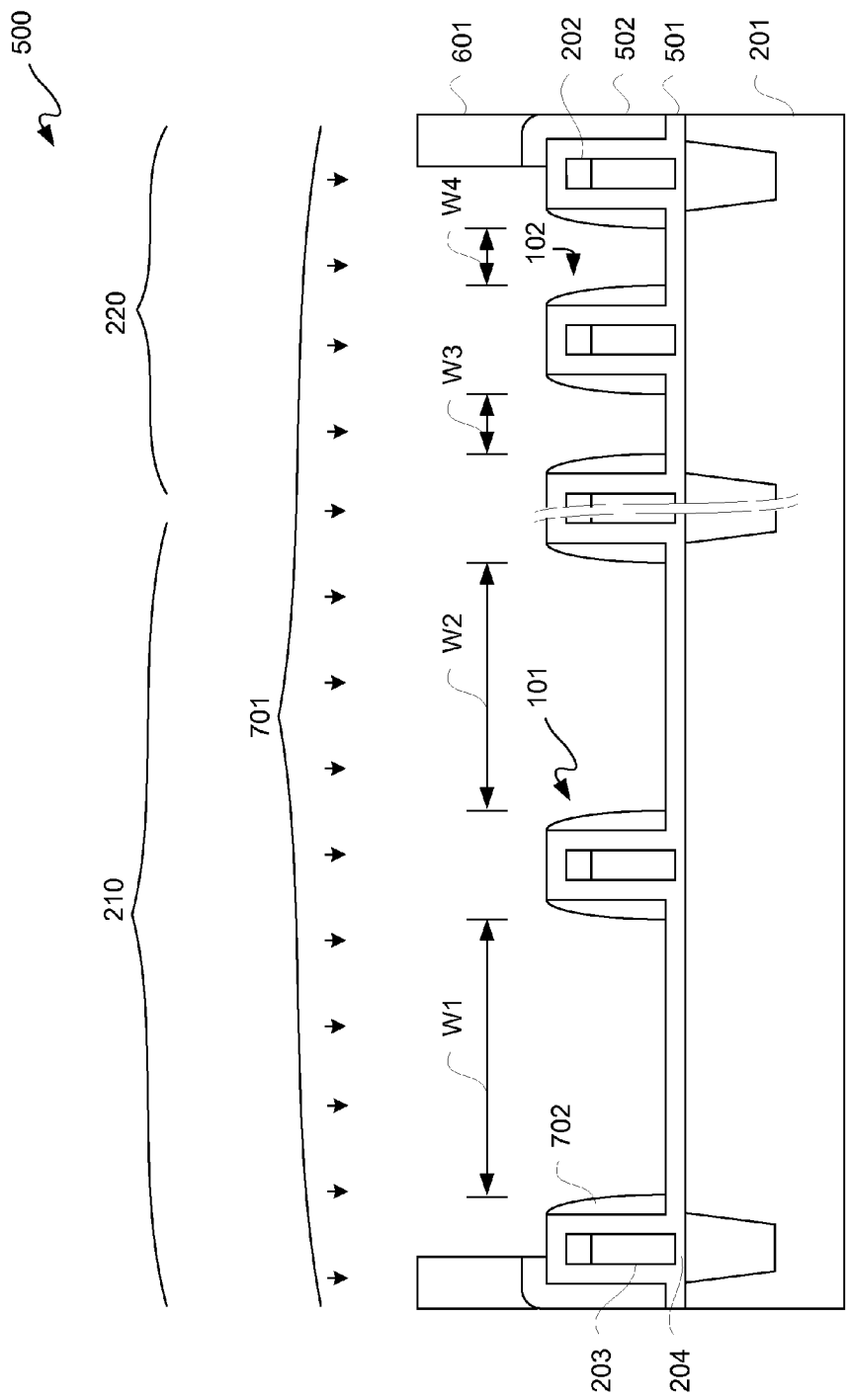

Referring to FIG. 7A, there is shown the cross-sectional view of FIG. 6 after or during a spacer etch 701. Spacer etch 701 is to remove nitride of hard mask layer 502 generally in wide pitch area 210 and narrow pitch area 220 of PMOS transistors 101 and 102, and also to remove nitride of hard mask layer 502 located above gate stacks of transistors 101 and 102.

Thus, spacer etch 701 leaves spacers 702 along sidewalls of hard mask layer 501 as associated with transistors 101 and 102, as well as with respect to sidewalls of dummy transistors 103 respectively associated with transistors 101 and 102. Spacers 702 are used to define widths W1 through W4 for subsequent self-aligned etching as described below in additional detail.

Figure 7B:
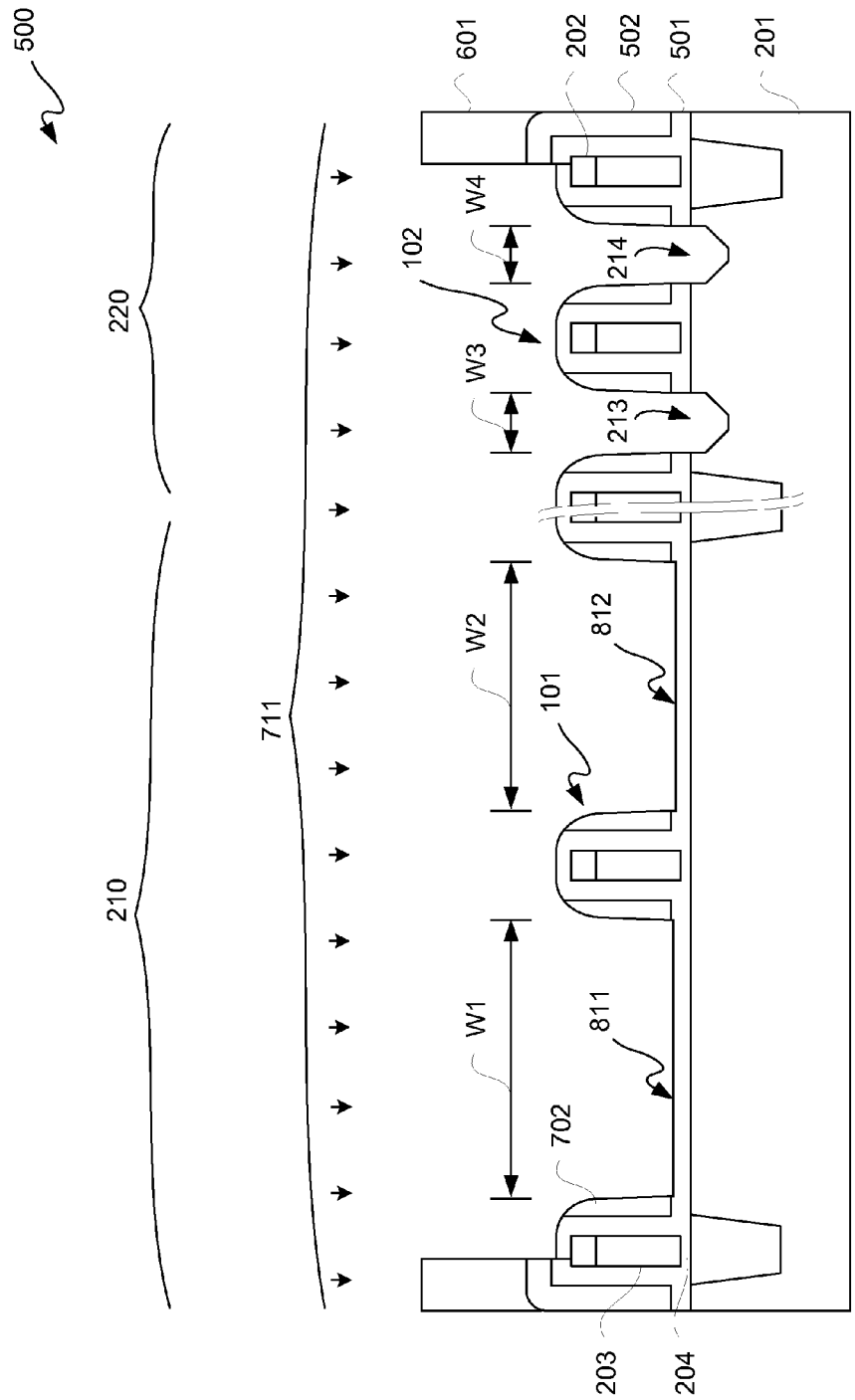

Referring to FIG. 7B, there is shown the cross-sectional view of FIG. 7A for an oxide and silicon recess etch 711. It should be understood that the removal of oxide of hard mask layer 501 is subject to loading effects where oxide removal is removed more rapidly in narrow opening areas, such as associated with widths W3 and W4.

After nitride spacer etch 701 of hard mask layer 502, chemistry of etch 701 may be changed in-situ for performing etch 711, or a separate etch operation 711 may be performed. For purposes of clarity by way of example and not limitation, it shall be assumed that nitride spacer etch 701 is a separate etch from an oxide hard mask etch for etching hard mask layer 501.

Etch 711 for etching hard mask layer 501 may be an anisotropic etch performed with an etchant gas, where such etchant gas includes hydrofluorocarbon, fluorocarbon, and carbon monoxide for etching with a high density plasma ("HDP"). Such high density plasma may ionize such carbon monoxide to generate CO+ and excited CO neutrals. Free fluorine from hydrofluorocarbon and fluorocarbon excited by CO neutrals may be removed from near surface regions in larger opening of in-process integrated circuit 500. This may further increase polymer deposition buildup on resist of mask layer 601 as well as increasing polymer deposition buildup on large opening areas, such as associated with W1 and W2. In the meantime, CO+ ions may diffuse into small openings, such as associated with widths W3 and W4, and etch deep narrow trenches in oxide layer 501. It should be appreciated that such etching of deep narrow trenches in oxide occurs while there is very limited or even no oxide etching formed in large open areas, such as associated with widths W1 and W2. An example of an HDP etch that may be used is described in additional detail in U.S. Pat. No. 6,486,070.

Accordingly, hard mask layer 501 is punched through and etches away part of silicon layer 201 in narrow pitch area 220 associated with widths W3 and W4 for source and drain regions more rapidly than in wide pitch area 210. Thus regions associated with widths W1 and W2 may have little etching penetration of hard mask layer 501 in comparison to removal in narrow channel openings associated with widths W3 and W4 of narrow pitch area 220. Furthermore, hard mask layer 501 disposed above gate protective spacer layer 202 may have little etching due to etch 711 in comparison to etching of hard mask layer 501 in narrow channel opening associated with widths W3 and W4.

It should be understood that a loading effect for width W1 greater than a width W2 may cause etching of hard mask layer 501 in width W2 to have faster removal of hard mask layer 501 than that of hard mask layer 501 in width W1. More generally, it should be understood that even though only two transistor gate stacks are generally shown, it should be understood that there may be pitches other than pitches associated with pitch areas 210 and 220. Again, assuming pitch associated with pitch area 210 is a widest pitch of integrated circuit 500 and pitch associated with pitch area 220 is a narrowest pitch of integrated circuit 500, there may be pitches of integrated circuit 500 between such extremes.

Because loading effects may have etch rates that vary according to openings associated with variation of pitches or LODs, the rate at which hard mask layer 501 is removed in those areas may vary according to pitch. This means that the breakthrough time for removing hard mask layer 501 for exposing an upper surface of silicon layer 201 may vary across various pitches and LODs. This variation in etch rates responsive to topology may be used to provide varying depths of source and drain recesses, which depths are greatest for narrowest pitch regions and progressively less as pitch increases.

Accordingly, PMOS transistors may have their performance equalized by having depths that correspond to the pitches associated with such transistors. Thus, even though only two examples are shown, it should be understood that other pitches may be used to provide various gradations of depths for equalizing performance among PMOS devices formed using more than two pitches.

Furthermore, if W1 was greater than W2, namely asymmetrically formed source and drain regions, then, as generally indicated, removal level 812, which may be defined as the height of hard mask layer 501 above an upper surface of silicon layer 201 as associated with width W2, may be lower than removal level 811 associated with width W1. Thus, a transistor with asymmetric source and drain regions may have asymmetric timing of punch-through of hard mask layer 501 to silicon layer 201, and this variation may be used to form asymmetrically deep source and drain regions of a same transistor device in order to equalize performance of such asymmetrical source and drain regions. For purposes of clarity by way of example and not limitation, it shall be assumed that widths W1 and W2 are generally equivalent even though asymmetric widths may be used. Likewise, for purposes of clarity by way of example and not limitation, it shall be assumed that widths W3 and W4 are equivalent widths even though asymmetric widths may be used.

Figure 7C:
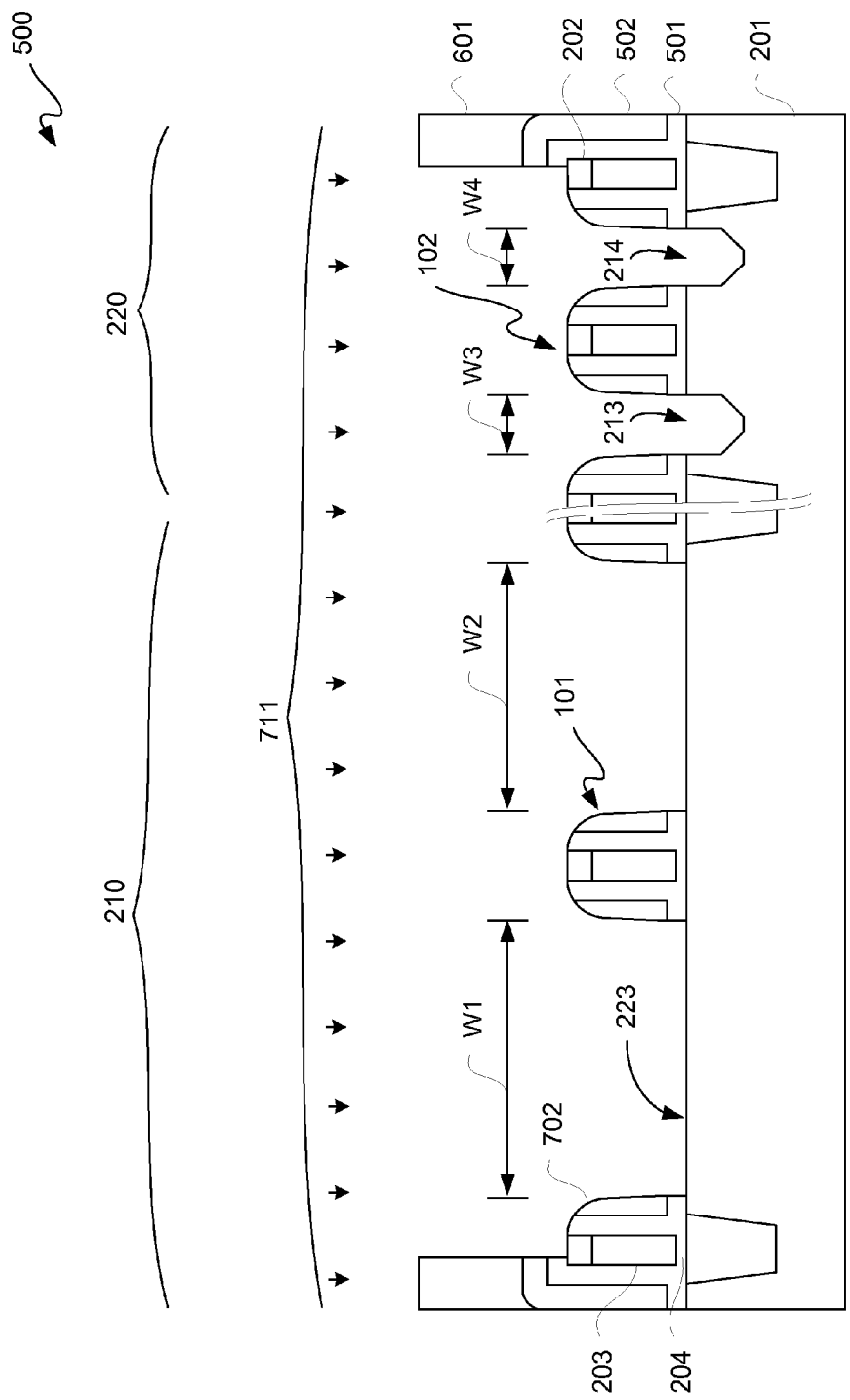

Referring to FIG. 7C, there is shown the cross-sectional view of FIG. 7B at a later point in time during the performance of etch 711. At this point in time, hard mask layer 501 is removed from an upper surface of spacer layer 202 and removed from an upper surface 223 of silicon layer 201 in source and drain regions associated with widths W1 and W2, and trenches 213 and 214 initially formed by recess etch 711 as illustratively depicted in FIG. 7B are now deeper as illustratively depicted in FIG. 7C.

Faster etching on small openings for oxide etch 711 may be controlled by an end point to stop at exposure of upper surface 223 of silicon layer 201. For example, at such an end point, etching chemistry or etching condition may be switched to be highly selective for silicon over oxide to generally etch only silicon 201 for forming recesses 213 and 214 as part of a change in chemistry of etch 711. With renewed reference to FIG. 7B, during etch 711 of FIG. 7B, widths W1 and W2 are still protected by hard mask layer 501 after switching chemistries for etching silicon to form recesses 213 and 214. Hence silicon layer 201 associated with widths W1 and W2 is still protected from this change in chemistries.

With masking layer 601 left in place, loading effects for removal of oxide of hard mask layer 501 may be used to provide access to silicon layer 201 for switching etch chemistry to a silicon etch; however, etch chemistry may subsequently be switched back for oxide removal. After sufficient depth of recesses 213 and 214 has been obtained, chemistry of etch 711 may then be changed back in-situ as indicated in FIG. 7C for removal of oxide of hard mask layer 501. Such switch in chemistry is back to a highly oxide-to-silicon selective etch to etch oxide of hard mask layer 501. In order to ensure removal of hard mask layer 501 in areas associated with widths W1 and W2, a timed etch may be used. In other words, etching time may be increased to ensure removal of oxide of hard mask layer 501 in source and drain regions associated with transistor 101.

Figure 7D:
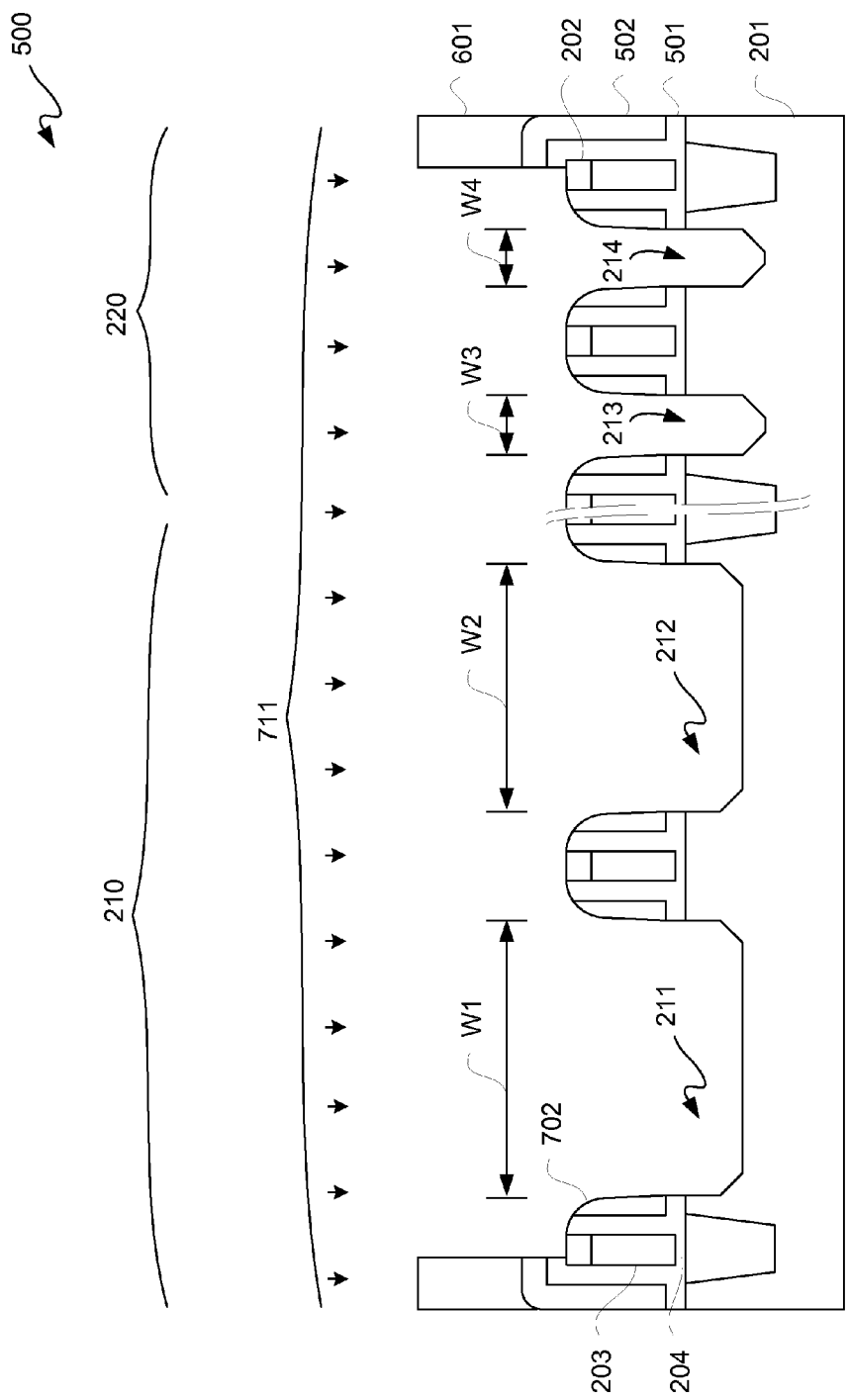

Referring to FIG. 7D, there is shown the cross-sectional view of FIG. 7C at a later point in time or after completion of silicon recess etch 711. Accordingly, recesses 211 through 214 as previously described may be formed, where recesses 213 and 214 are deeper than recesses 211 and 212 as previously described.

After sufficient time has elapsed to ensure removal of oxide of hard mask layer 501 from an upper surface 223 of FIG. 7C of silicon layer 201, etching chemistry of etch 711 may again be changed in-situ as generally indicated in FIG. 7D for switching back again to being highly silicon-selective to etch silicon of silicon layer 201 for forming trenches, namely trenches 211 through 214, respectively associated with widths W1 through W4. Thus, etch depth for forming recesses or trenches 213 and 214 may take into consideration microloading effects of etching used to form trenches 211 and 212, where trenches 213 and 214 etch more slowly than trenches 211 and 212. Again, as previously described, loading effects for a silicon etch causes etching to be more rapid in wide pitch areas than in narrow pitch areas, such as wide pitch area 210 as compared with narrow pitch area 220. Thus exposed areas of upper surface 223 associated with widths W1 and W2 etches faster than recesses 213 and 214 for silicon etching.

Again, it should be further understood that oxide etching of etch 711 of FIG. 7B may introduce some shallow to medium depth oxide trenching at openings of relatively medium size, as previously described and thus the oxide etch of etch 711 of FIG. 7C may have some slight etching into silicon layer 201 due to punch-through or opening occurring earlier in time than in large opening areas. Such additional slight to additional early etching into silicon layer 201 may be used to further adjust depth of eSiGe trenching according to opening or pitch size to further help reduce LOD effect on performance variation.

Figure 8:
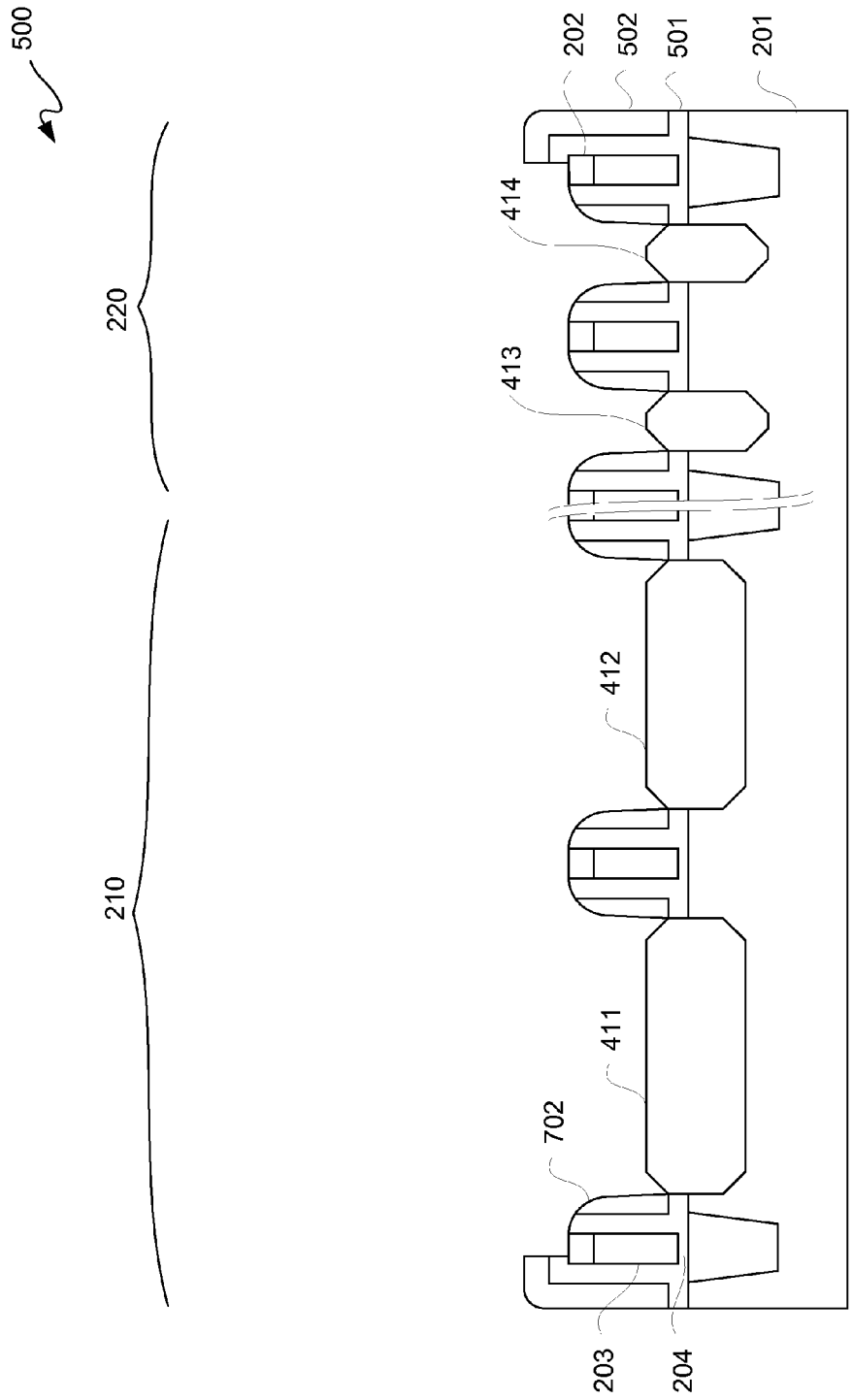

Referring to FIG. 8, there is shown the cross-sectional view of FIG. 7D, after forming SiGe source drain regions 411 through 414, as previously described. Thus it should be understood that source and drain regions 411 through 414 of integrated circuit 500 may be the same as those source and drain regions of integrated circuit 200 of FIG. 4. Thus, integrated circuits 200 and 500 may be formed using various methodologies as described herein starting from the same in-process integrated circuit 100 of FIG. 1.

Accordingly, it should be appreciated that performance variation among PMOS transistors due to a LOD effect or variation in pitch may be facilitated by increasing eSiGe volume by growing such eSiGe in deeper source/drain PMOS regions of narrow width, namely "SA/SB" regions. Such deeper silicon trenches with smaller openings may be formed by adding another mask for etching or by adjusting an etch process without the addition of another mask.

Pitch topology may negatively affect transistor performance for narrow LODs. In view of simulation using software known as FAMMOS available from Synopsis of Mountain View, Calif., a 20 nm difference in depth may result in a mobility enhancement of greater than 90%. Furthermore, based on such stress simulations, a 40 nm difference in trench or recess depth may result in a mobility enhancement of greater than 93%. Accordingly, mobility may be improved in minimum pitch area 220 by having source/drain regions in such pitch area 220 deeper than source/drain regions in widest pitch area 210.

The selected deeper SEG of one or more eSiGe films may enhance mobility generally due to a larger "Syy" tensile stress, namely the tensile stress associated with the vertical access extending through a channel. Thus, the overall mechanical stress induced by the addition of one or more eSiGe films for forming source drain regions may improve mobility for larger volumes of such eSiGe being generally near to a channel.

Because generally no eSiGe growth is present along an STI dielectric side of a diffusion region, such as a source or drain region, (e.g., there is no eSiGe present on an oxide), an eSiGe profile close to such STI structure tends to degrade. This degradation is more significant in smaller spaces, namely where SA/SB regions are each less than 0.15 microns in width. Thus, for devices made with such a small SA/SB, enhancement of eSiGe volume in order to equalize performance may be used. Accordingly, it should be understood that eSiGe makes up a larger percentage of effect on performance for smaller SA/SB transistors. As described above, this LOD affect causes PMOS performance variation between small and large SA/SB transistors. While ideally, having uniform transistor performance may be desired, at least by adjusting performance of transistors with different SA/SB values as described above, performance of transistors formed with substantially different topologies may at least be substantially equalized.

To compensate for stress loss due to eSiGe near an STI edge, as well as possibly less eSiGe volume for small SA/SB transistors, selective recess etching of silicon for forming deeper recesses for source drain regions associated with such small SA/SB transistors is used for growing deeper eSiGe. It should be appreciated that a deeper recess does not affect footprint, namely x and y directions, of such small SA/SB transistors and thus the likelihood of violating a design rule due to such deeper etching is unlikely. Furthermore, the footprint in the x and y directions of such small SA/SB transistors is unchanged, and thus no additional area of silicon layer 201 is used.

Figure 9:
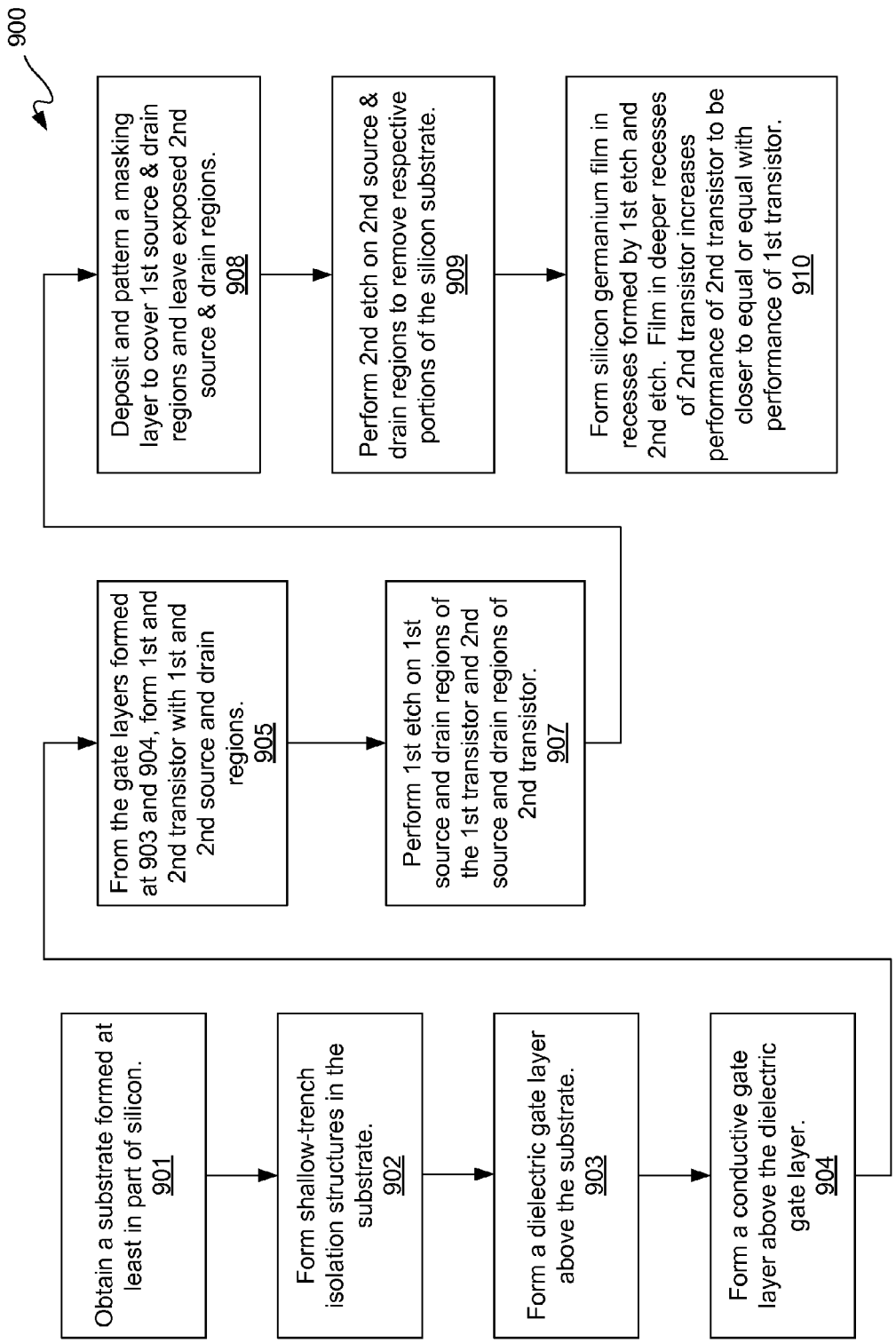
FIG. 9 is a flow diagram depicting an exemplary embodiment of a PMOS device formation flow.

FIG. 9 is a flow diagram depicting an exemplary embodiment of a PMOS device formation flow 900. With reference to FIGS. 1, 2A, 2B, 3A, 3B, 4, and 9, PMOS device formation flow 900 is further described.

At 901, a substrate formed at least in part of silicon is obtained. Such substrate may be, for example, silicon layer 201. At 902, shallow-trench isolation structures, such as for example STI structures 205 and 206, are formed in the substrate. At 903, a dielectric gate layer, such as for example gate dielectric layer 204, is formed above the substrate. At 904, a conductive gate layer, such as for example gate conductive layer 203, is formed above the dielectric gate layer.

At 905, a first transistor and a second transistor, such as for example transistors 101 and 102, are formed from the gate layers formed at 903 and 904. Such first transistor has a source side channel and a drain side channel. Such channels are substantially equivalent to each other in terms of width and length. LOD regions extend substantially from each such channel to an area associated with an STI structures 205 and 206 on both a source side and a drain side. For example, in FIG. 1, such first source and drain regions respectively associated with such first transistor correspond to widths W1 and W2, and second source and drain regions associated with the second transistor respectively correspond to widths W3 and W4. It should be understood that the first source region of the first transistor is substantially greater in width than the second source region of the second transistor. Similarly, the first drain region of the first transistor is substantially greater in width than the second drain region channel of the second transistor. The first source region, the second source region, the first drain region, and the second drain region are of the silicon of the substrate.

At 907, the first source region and the first drain region of the first transistor are respectively first etched and a second source region and a second drain region of the second transistor are respectively first etched. For example, such first etch may be recess etch 302 of FIG. 2A. At 908, a masking layer, such as for example mask 322, is deposited and patterned. The masking layer after patterning covers the first source region and the first drain region and leaves exposed the second source region and the second drain region. At 909, the second source region and the second drain region are second etched to remove respective portions of the silicon. Such second etch may for example be recess etch 301 of FIG. 2B. It should be understood that, in combination, the first etching performed at 907 and the second etching performed at 909 form first recesses and second recesses defined in the silicon having different depths. The first recesses are associated with the first source region and the first drain region, and the second recesses are associated with the second source region and the second drain region. The second recesses are at least 20 nanometers deeper than the first recesses.

At 910, silicon germanium film is formed in the first recesses and the second recesses. The silicon germanium film in the second recesses increases performance of the second transistor to be closer to equal or equal with performance of the first transistor.

Figures 1, 10:
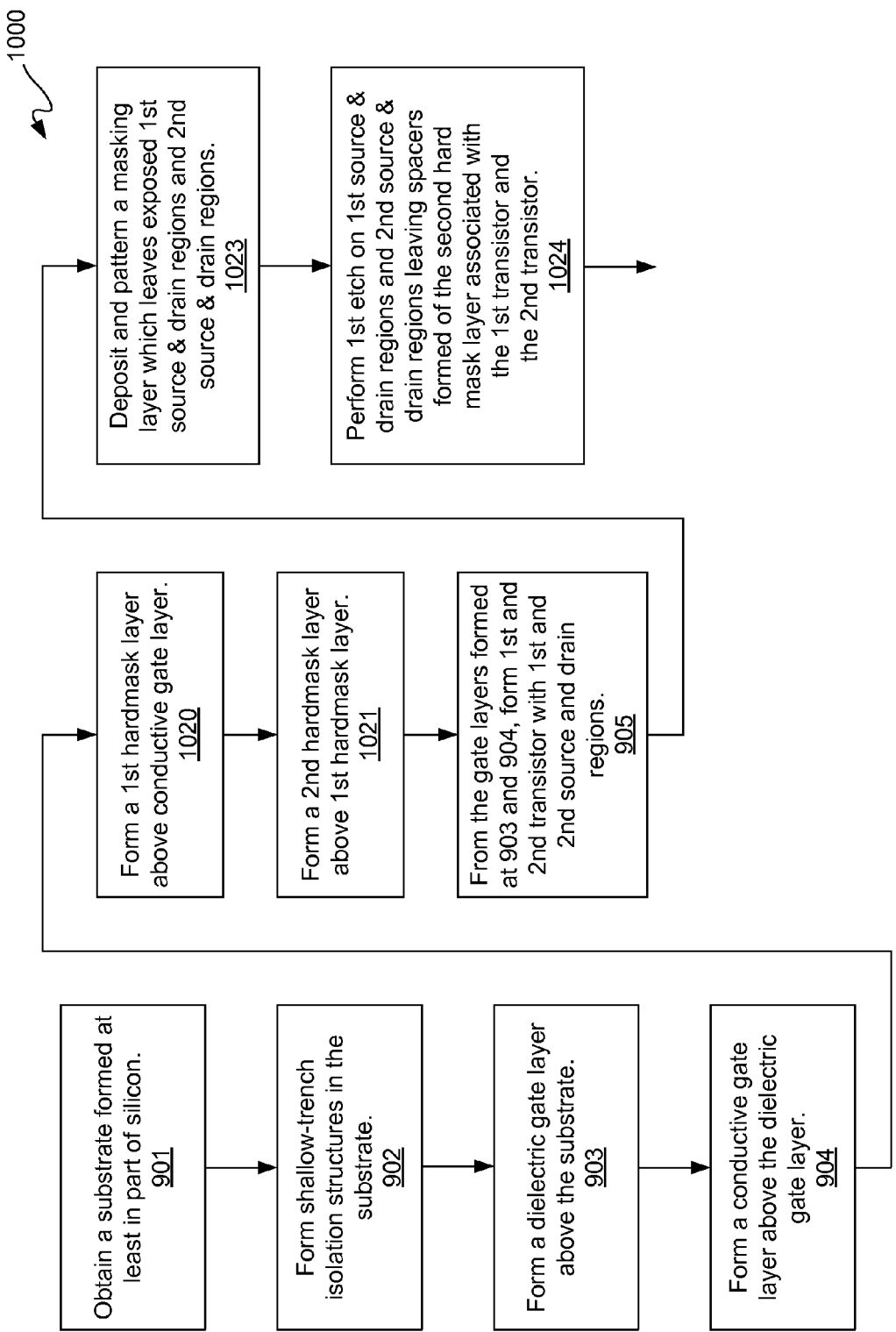
FIG. 10, divided into
Figures 2, 10:
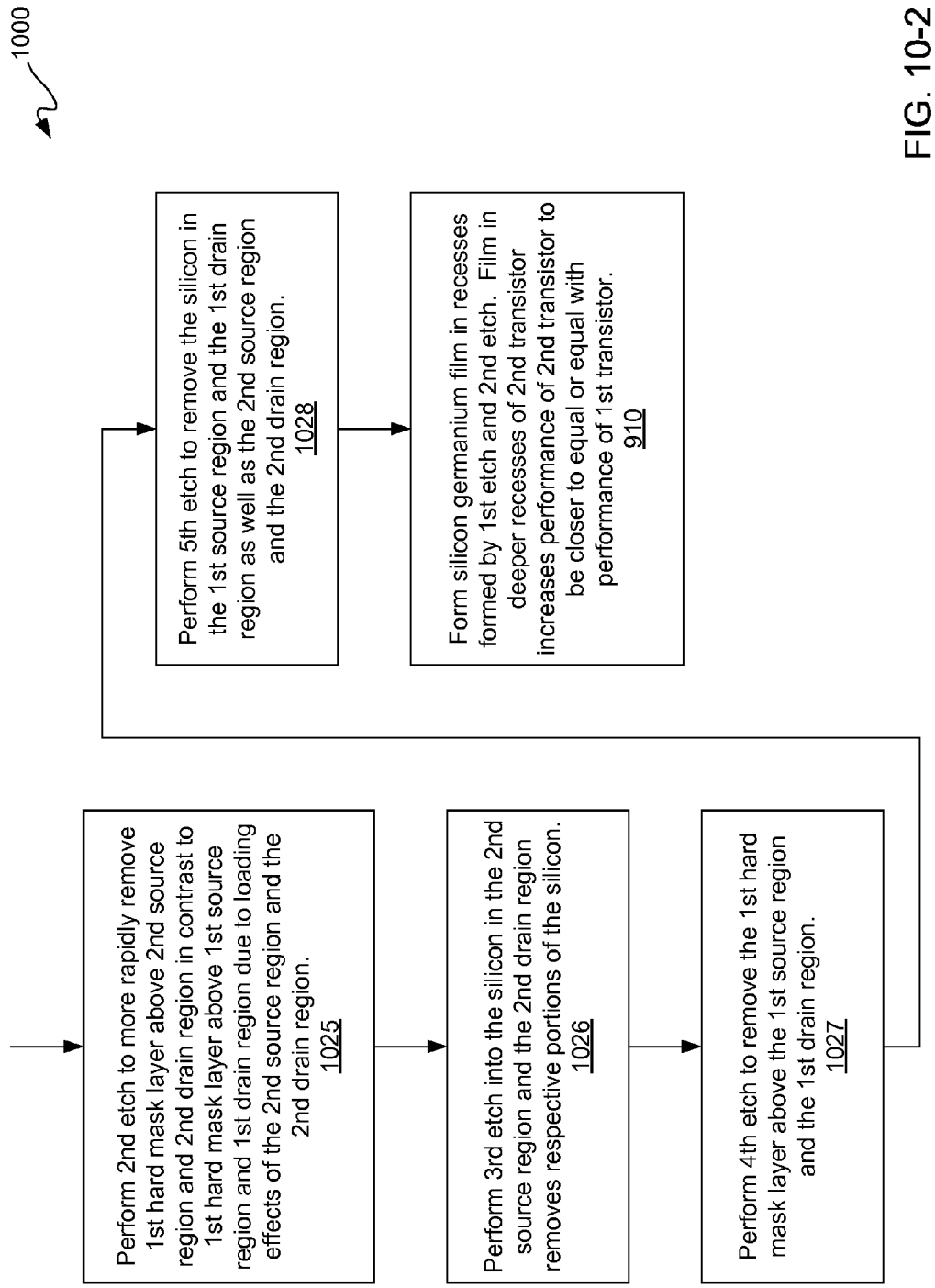

FIG. 10 is a flow diagram depicting an exemplary embodiment of an alternative PMOS device formation flow 1000. Although FIG. 10 is divided into two segments, namely FIGS. 10-1 and 10-2, it should be understood that FIGS. 10-1 and 10-2 form a single drawing, namely FIG. 10, and that FIGS. 10-1 and 10-2 illustratively depict respective portions of a single flow, namely PMOS device formation flow 1000. With reference to FIGS. 1, 5, 6, 7A, 7B, 7C, 7D, 8, and 10, PMOS device formation flow 1000 is further described.

Steps 901 through 904 of flow 900 of FIG. 9 are repeated to initiate PMOS device formation flow 1000; description of steps 901 through 904 is not repeated for purposes of clarity.

At 1020, a first hard mask layer, such as for example conformal layer 501 of FIG. 5, is formed above the conductive gate layer formed at 904. At 1021, a second hard mask layer, such as for example conformal layer 502 of FIG. 5, is deposited above the first hard mask layer formed at 1020. After formation of the second hard mask layer at 1021, first and second transistors are formed as described above with respect to step 905. Such description is not repeated for purposes of clarity.

At 1023, a masking layer, such as for example masking layer 601 of FIG. 6, is deposited and patterned. The masking layer after patterning leaves exposed the first source region, the first drain region, the second source region, and the second drain region. Etching using at least one etch is then performed. More particularly, at 1024, the second hard mask layer is first etched leaving spacers formed of the second hard mask layer associated with the first transistor and the second transistor. Such first etching may be, for example, spacer etch 701 of FIG. 7A which removes nitride of hard mask layer 502 to form spacers 702. The spacers are disposed along sidewalls of the first hard mask layer conforming to sidewalls of a gate of the first transistor and to sidewalls of a gate of the second transistor. The first etching removes the second hard mask layer above the first source region, the first drain region, the second source region, and the second drain region.

At 1025, a second etching, which may for example be etch 711 of FIG. 7B, more rapidly removes the first hard mask layer above the second source region and the second drain region in contrast to the first hard mask layer above the first source region and the first drain region. The second etching removes the first hard mask layer more rapidly due to loading effects of the second source region and the second drain region as described above with respect to FIG. 7B. At 1026, third etching into the silicon in the second source region and the second drain region removes respective portions of the silicon. At 1027, fourth etching removes the first hard mask layer above the first source region and the first drain region. At 1028, fifth etching removes the silicon in the first source region and the first drain region as well as the second source region and the second drain region. The third, fourth, and fifth etchings respectively performed at 1026 through 1028 may, for example, be etch 711 of FIGS. 7B through 7D with in-situ changing of chemistries.

It should be understood that the etchings performed at 1024 through 1028 form first recesses and second recesses defined in the silicon and having different depths. The first recesses are associated with the first source region and the first drain region, and the second recesses are associated with the second source region and the second drain region. The second recesses are at least 20 nanometers deeper than the first recesses.

Following the fifth etching, at 910, a silicon germanium film is formed in the first recesses and the second recesses as in flow 900. As described above, the silicon germanium film in the second recesses increases performance of the second transistor to be closer to equal or equal with performance of the first transistor.

Figure 11:
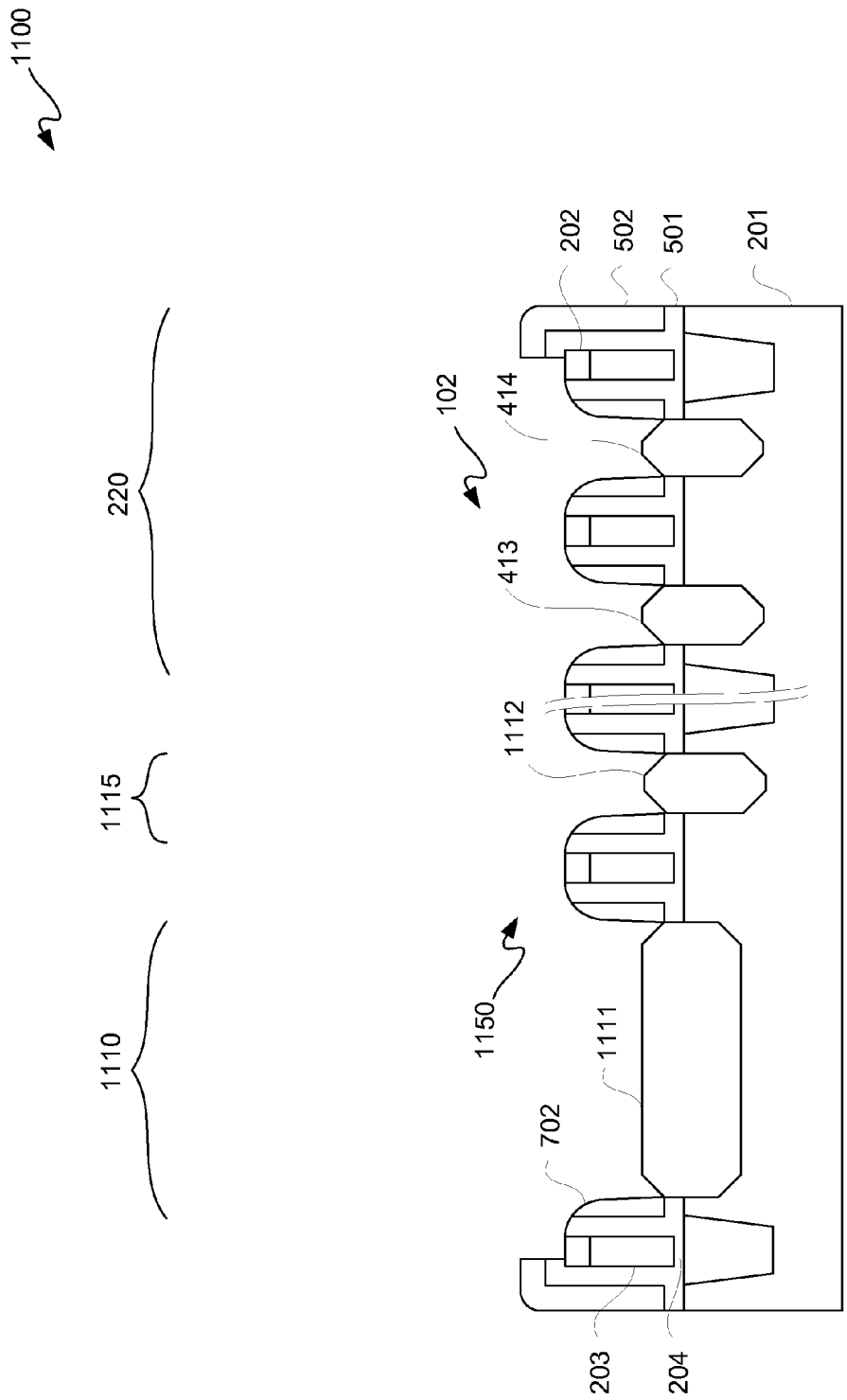
FIG. 11 is a cross-sectional view depicting an exemplary embodiment of yet another in-process integrated circuit, such as the in-process integrated circuit of FIG. 1, except with an asymmetric LODs for source and drain regions.

FIG. 11 is a cross-sectional view depicting an exemplary embodiment of yet another in-process integrated circuit 1100 with an asymmetric LOD for source and drain regions. For example, a transistor 1150 may have a source region 1111 and a drain region 1112. Such regions are shown after growth of an eSiGe for purposes of clarity and not limitation, as such growth follows from the above description. Moreover, drain region 1112 is substantially deeper into silicon layer 201 than source region 1111. Source region 1111 may have an LOD associated with SA 1110, and drain region 1112 may have an LOD associated with SB 1115. In this exemplary embodiment, SA 1110 is substantially wider than SB 1115. However, in another embodiment, SA may be substantially narrower than SB.

For transistor 1150, degradation due to an LOD effect may be roughly the average result from source and drain regions 1111 and 1112. In other words, if performance variation due to an extremely narrow SA and an extremely narrow SB for a transistor without adjustment, as described herein, was approximately 10%, and there was little to no variation for a transistor with a wide SA and a wide SB, then, while not wishing to be bound by theory, it is believed that the overall effect for a PMOS transistor with asymmetric SA/SB, such as a wide SA and an extremely narrow SB in above example, may be approximately 5%. Thus, by selectively growing eSiGe in a deeper recess associated with either a narrow SA or SB as compared with a wide SB or SA, respectively, of an asymmetric SA/SB transistor, variation due to narrow SA or SB of such transistor may be reduced by forming a deeper recess associated with such narrower side for eSiGe, as previously described. Thus, even though PMOS transistor 1150 and 102 may have at least approximately equivalent W/Ls, their performance may be generally equalized by forming one source/drain recess, in this example as associated with drain region 1112, deeper than the other source/drain recess.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for forming a device of an integrated circuit, comprising:
  obtaining a substrate formed at least in part of silicon;
  forming shallow-trench isolation structures in the substrate;
  forming a dielectric gate layer above the substrate;
  forming a conductive gate layer above the dielectric gate layer;
  forming a first hard mask layer above the conductive gate layer;
  depositing a second hard mask layer above the first hard mask layer,
  wherein:
    the dielectric gate layer and the conductive gate layer for transistor devices have at least substantially equivalent channel widths and lengths,
    a first transistor of the transistor devices has a first source side spacing and a first drain side spacing,
    a second transistor of the transistor devices has a second source side spacing and a second drain side spacing,
    the first source side spacing is substantially greater than the second source side spacing, and
    the first drain side spacing is substantially greater than the second drain side spacing;
  depositing and patterning a masking layer, wherein the masking layer after patterning leaves exposed the first source region, the first drain region, the second source region, and the second drain region;
  performing at least one etch, wherein the at least one etch includes:
    etching the second hard mask layer leaving spacers formed of the second hard mask layer associated with the first transistor and the second transistor, wherein the spacers are disposed along sidewalls of the first hard mask layer conforming to sidewalls of a gate of the first transistor and to sidewalls of a gate of the second transistor, wherein the etching forms first recesses and second recesses and the second recesses are deeper than the first recesses; and
  forming a silicon germanium film in the first recesses and the second recesses, wherein the silicon germanium film in the second recesses is thicker than the silicon germanium film in the first recesses.

2. The method according to claim 1, wherein:
  the first source side spacing is lateral from a channel of the first transistor to a first shallow-trench isolation structure of the shallow-trench isolation structures;
  the first drain side spacing is lateral from the channel of the first transistor to a second shallow-trench isolation structure of the shallow-trench isolation structures;
  the second source side spacing is lateral from a channel of the second transistor to a third shallow-trench isolation structure of the shallow-trench isolation structures; and
  the second drain side spacing is lateral from the channel of the second transistor to a fourth shallow-trench isolation structure of the shallow-trench isolation structures.

3. The method according to claim 2, wherein:
  the channel of the first transistor is at least substantially equivalent in length and width to the channel of the second transistor;
  the first transistor includes a first source region and a first drain region respectively associated with the first source side spacing and the first drain side spacing; and
  the second transistor includes a second source region and a second drain region respectively associated with the second source side spacing and the second drain side spacing.

4. The method according to claim 3, wherein:
  the etching includes a first etching, a second etching, a third etching, a fourth etching, and a fifth etching;
  the first etching removes the second hard mask layer above the first source region, the first drain region, the second source region, and the second drain region;
  the second etching removes the first hard mask layer above the second source region and the second drain region in contrast to the first hard mask layer above the first source region and the first drain region;
  the second etching removes the first hard mask layer in part responsive to loading effects of the second source side spacing and the second drain side spacing;
  the third etching is into the silicon in the second source region and the second drain region and removes respective portions of the silicon;
  the fourth etching removes the first hard mask layer above the first source region and the first drain region; and
  the fifth etching removes the silicon in the first source region and the first drain region as well as the second source region and the second drain region.

5. The method according to claim 3, wherein
the first recesses are associated with the first source region and the first drain region; and
the second recesses are associated with the second source region and the second drain region.

6. The method according to claim 5, wherein:
the forming of a silicon germanium film is by selective epitaxial growth; and
the silicon germanium layer in the second recesses increases carrier mobility of the second transistor by at least 90 percent to increase performance of the second transistor to be closer to or equal with performance of the first transistor.

7. The method according to claim 5, further comprising:
depositing a dielectric spacer layer above the conductive gate layer prior to the forming of the first hard mask layer;
the gate of the first transistor and the gate of the second transistor both are formed using the conductive gate layer; and
performing an etch of the dielectric spacer layer prior to the forming of the first hard mask layer.

8. The method according to claim 7, wherein the second recesses are at least 20 nanometers deeper than the first recesses.

9. The method according to claim 7, wherein the substrate is selected from the group consisting of a bulk silicon wafer and a silicon-on-insulator wafer.

10. An integrated circuit having devices, comprising:
a first transistor associated with a first pitch;
a second transistor associated with a second pitch, wherein the second pitch is substantially smaller than the first pitch;
a first channel of the first transistor having a first width and a first length; and
a second channel of the second transistor having a second width and a second length,
wherein the first width is approximately equal to the second width, the first length is approximately equal to the second length, the first transistor has a first source region and a first drain region, the second transistor has a second source region and a second drain region, and
wherein each of the first source region and the first drain region is substantially wider in a horizontal direction than the second source region and the second drain region in relation to the second pitch being substantially smaller than the first pitch, and each of the second source region and the second drain region is deeper in a vertical direction than the first source region and the first drain region to increase performance of the second transistor so it is closer to performance of the first transistor.

11. The integrated circuit according to claim 10, further comprising:
a substrate having silicon;
shallow-trench isolation structures in the substrate;
a dielectric gate layer disposed above the substrate;
a conductive gate layer disposed above the dielectric gate layer;
a first hard mask layer disposed along sidewalls of the conductive gate layer; and
a second hard mask layer disposed along sidewalls of the first hard mask layer,
wherein:
the first hard mask layer and the second hard mask layer provide spacers,
the dielectric gate layer and the conductive gate layer for transistor devices have substantially equal channel widths and lengths,
the first transistor being of the transistor devices,
the first transistor has a first source side spacing and a first drain side spacing associated with the first pitch,
the first source side spacing is lateral from the first channel of the first transistor to a first shallow-trench isolation structure of the shallow-trench isolation structures,
the first drain side spacing is lateral from the first channel of the first transistor to a second shallow-trench isolation structure of the shallow-trench isolation structures,
the second transistor being of the transistor devices,
the second transistor has a second source side spacing and a second drain side spacing associated with the second pitch,
the second source side spacing is lateral from the second channel of the second transistor to a third shallow-trench isolation structure of the shallow-trench isolation structures,
the second drain side spacing is lateral from the second channel of the second transistor to a fourth shallow-trench isolation structure of the shallow-trench isolation structures,
the first source side spacing is substantially greater than the second source side spacing,
the first drain side spacing is substantially greater than the second drain side spacing,
the first source region and the first drain region respectively associated with the first source side spacing and the first drain side spacing,
the second source region and the second drain region respectively associated with the second source side spacing and the second drain side spacing,
first recesses and second recesses defined in-process in the silicon having different depths in which a silicon germanium film is formed,
the first recesses are associated with the first source region and the first drain region,
the second recesses are associated with the second source region and the second drain region, and
the second recesses are at least 20 nanometers deeper than the first recesses.

12. The integrated circuit according to claim 11, further comprising:
a third transistor associated with a third pitch, wherein the third pitch is between the first pitch and the second pitch; and
a third channel of the third transistor has a third width and a third length, wherein the third width is at least approximately equal to the second width, and the third length is approximately equal to the second length,
wherein the third transistor has a third source region and a third drain region,
one of the third source region and the third drain region is substantially narrower in a horizontal direction than the other of the third source region and the third drain region; and
the narrower one of the third source region and the third drain region is at least 20 nanometers deeper in a vertical direction than the other of the third source region and the third drain region to increase performance of the third transistor so it is closer to performance of the first transistor.

* * * * *